United States Patent
Temmler

(10) Patent No.: US 7,410,864 B2
(45) Date of Patent: Aug. 12, 2008

(54) TRENCH AND A TRENCH CAPACITOR AND METHOD FOR FORMING THE SAME

(75) Inventor: Dietmar Temmler, Dresden (DE)

(73) Assignee: Infineon Technologies AG, Munich (DE)

( * ) Notice: Subject to any disclaimer, the term of this patent is extended or adjusted under 35 U.S.C. 154(b) by 369 days.

(21) Appl. No.: 11/108,154

(22) Filed: Apr. 15, 2005

(65) Prior Publication Data

US 2005/0250290 A1    Nov. 10, 2005

Related U.S. Application Data

(60) Provisional application No. 60/564,613, filed on Apr. 23, 2004.

(51) Int. Cl.
     *H01L 21/8242*    (2006.01)
(52) U.S. Cl. .................. 438/245; 438/244; 438/387; 438/388; 257/E27.092; 257/E21.09; 257/E21.461
(58) Field of Classification Search ............... 438/244, 438/245, 387, 388; 257/E27.092, E21.09, 257/E21.461
See application file for complete search history.

(56) References Cited

U.S. PATENT DOCUMENTS

| | | | | |
|---|---|---|---|---|
| 4,924,284 A * | 5/1990 | Beyer et al. ................. | 257/621 |
| 4,988,637 A * | 1/1991 | Dhong et al. ............... | 438/245 |
| 6,018,174 A * | 1/2000 | Schrems et al. ............. | 257/296 |
| 6,156,606 A | 12/2000 | Michaelis | |
| 6,200,873 B1 | 3/2001 | Schrems et al. | |
| 6,207,494 B1 * | 3/2001 | Graimann et al. ........... | 438/248 |
| 6,258,692 B1 | 7/2001 | Chu et al. | |
| 6,319,787 B1 | 11/2001 | Enders et al. | |
| 6,372,604 B1 | 4/2002 | Sakai et al. | |
| 6,429,068 B1 | 8/2002 | Divakaruni et al. | |
| 6,500,707 B2 * | 12/2002 | Schrems ..................... | 438/249 |
| 6,821,863 B2 * | 11/2004 | Popp et al. .................. | 438/400 |
| 7,049,647 B2 * | 5/2006 | Karcher et al. .............. | 257/301 |
| 7,122,439 B2 * | 10/2006 | Kwon et al. ................. | 438/386 |
| 2002/0132421 A1 * | 9/2002 | Schrems ..................... | 438/241 |
| 2004/0227174 A1 | 11/2004 | Richter et al. | |
| 2004/0247788 A1 * | 12/2004 | Fang et al. .................. | 427/250 |

FOREIGN PATENT DOCUMENTS

DE    199 29 859 A1    4/2000
DE    101 28 211 C1    7/2002

* cited by examiner

*Primary Examiner*—Michelle Estrada
(74) *Attorney, Agent, or Firm*—Slater & Matsil, L.L.P.

(57) ABSTRACT

A method for fabricating a trench includes providing a semiconductor substrate made of a semiconductor material. A trench is etched into a surface of the semiconductor substrate such that a trench wall is produced. At least one layer is provided on the trench wall. This step is performed in such a way that the topmost layer provided on the trench wall is constructed from a sealing material. A selective epitaxy method is carried out in such a way that a monocrystalline semiconductor layer is formed on the surface of the semiconductor substrate and preferably no semiconductor material grows directly on the sealing material. A partial trench is etched in a surface of the epitaxially grown semiconductor layer. This step is performed in such a way that at least part of the layer made of the sealing material is uncovered. An uncovered part of the layer made of the sealing material is then removed.

30 Claims, 23 Drawing Sheets

TRENCH AND A TRENCH CAPACITOR AND METHOD FOR FORMING THE SAME

This application claims the benefit of U.S. Provisional Application No. 60/564,613, filed on Apr. 23, 2004, which application is hereby incorporated herein by reference.

TECHNICAL FIELD

The invention relates to a method for fabricating a trench, to a method for fabricating a trench capacitor, to a method for fabricating a memory cell, to a trench, to a trench capacitor, and to a memory cell having such a trench capacitor.

BACKGROUND

Memory cells of dynamic random access memories (DRAMs) generally comprise a storage capacitor and a selection transistor. An information item is stored in the storage capacitor in the form of an electrical charge, which represents a logic quantity 0 or 1. By driving the read-out or selection transistor via a word line, the information stored in the storage capacitor can be read out via a bit line. For reliable storage of the charge and distinguishability of the information read out, the storage capacitor must have a minimum capacitance. The lower limit for the capacitance of the storage capacitor is at the present time seen as approximately 25 fF.

Since the storage density increases from memory generation to memory generation, the required area of the one-transistor memory cell has to be reduced from generation to generation. At the same time, the minimum capacitance of the storage capacitor has to be maintained.

Up to the 1 Mbit generation, both the read-out transistor and the storage capacitor were realized as planar components. Starting with the 4 Mbit memory generation, a further reduction in the area of the memory cell was obtained through a three-dimensional arrangement of the storage capacitor. One possibility consists in realizing the storage capacitor in a trench. In this case, by way of example, a diffusion region adjoining the wall of the trench and also a doped polysilicon filling in the trench act as electrodes of the storage capacitor. The electrodes of the storage capacitor are thus arranged along the surface of the trench. This enlarges the effective area of the storage capacitor, on which the capacitance depends, relative to the space requirement for the storage capacitor at the surface of the substrate, which corresponds to the cross section of the trench. The packing density can be increased further by reducing the cross section of the trench whilst simultaneously increasing its depth.

Numerous measures have been implemented in the past in order to increase the storage capacitance of the trench capacitors. One measure is scaling the thickness of the storage dielectric. Furthermore, it is possible to enlarge the surface within the trench capacitor by wet-chemical expansion of the trench structure (bottle). Moreover, it is possible to enlarge the surface within the trench by means of a roughness, for example by means of HSG (hemispherical grain) polysilicon coating.

Further approaches comprise minimizing the electron depletion of the capacitor electrodes by increasing the doping of the Si electrode material, or the use of metal electrodes, as a result of which the resistance of the electrodes can at the same time be drastically reduced.

In addition, the previous NO dielectric may be replaced by high-k dielectrics in order to increase the capacitance of the trench capacitor. What is problematic for example in introducing a high-k dielectric having a high dielectric constant and also metal electrodes is, in particular, the temperature sensitivity of these materials. In addition, it is usually the case that new technologies actually have to be developed in the first place for new materials.

In order to produce trench structures having a high aspect ratio, that is to say a high ratio of depth to diameter or width, attempts are furthermore made to optimize the etching parameters for etching the hard mask stack and for etching the trench, for example by optimizing the parameters power, plasma density, frequency, bias voltage, etching gas, pressure, flow, etching time. Moreover, materials and layer thicknesses of the individual components of the hard mask for the etching of the trench are optimized. However, with the etching methods currently used to fabricate trench capacitors, technical and economic limits are increasingly being reached, since, by way of example, the etching rate and the selectivity of the etching decrease with increasing depth. As a consequence, the hard mask for the etching of the trench is etched to a great extent at the surface. At the present time, a maximum value for the aspect ratio that can be achieved by means of technologies currently being used is estimated at approximately 60 to 70.

German patent application 102 02 140, which corresponds to U.S. Patent Application Publication 2003/0136994, and U.S. Pat. No. 6,821,863, describes a method for selective epitaxial overgrowth of a cavity in a monocrystalline silicon substrate. The German and U.S. documents are incorporated herein by reference. This method can be used for example to form a trench for a trench capacitor in a silicon substrate, the trench capacitor being completed only after high-temperature steps have been carried out and being overgrown epitaxially before the high-temperature steps are carried out.

SUMMARY OF THE INVENTION

In one aspect, the present invention provides a method that can be used to produce a trench having a high aspect ratio.

In another aspect, the present invention provides a method that can be used to produce a trench capacitor having a high aspect ratio.

In a further aspect, the present invention specifies a method for fabricating a memory cell having such a trench capacitor. Embodiments of the invention, moreover, provide a trench, trench capacitor and also a memory cell having such a trench capacitor.

According to a preferred embodiment of the present invention, a method for fabricating a trench comprises providing a semiconductor substrate made of a semiconductor material, the semiconductor substrate having a surface. An opening is etched into the surface of the semiconductor substrate, the opening having a sidewall. At least one layer or filling is provided so that the sidewall is masked and a resulting surface of the opening is made of a sealing material. A selective epitaxy method is carried out in such a way that a monocrystalline semiconductor layer is formed on the surface of the semiconductor substrate, wherein the surface of the opening being covered by the sealing material is laterally overgrown. Thereafter, a partial trench is etched in a surface of the epitaxially grown semiconductor layer such that at least part of the layer made of the sealing material is uncovered. Finally, the uncovered part of the layer made of the sealing material is removed, thereby completing the trench.

Differently speaking, a method for fabricating a trench includes providing a semiconductor substrate made of a semiconductor material. A trench is etched into a surface of the semiconductor substrate such that a trench wall is produced. At least one layer is provided on the trench wall. This step is performed in such a way that the topmost layer provided on the trench wall is constructed from a sealing material. A selective epitaxy method is carried out in such a way that a monocrystalline semiconductor layer is formed on the surface of the semiconductor substrate and no semiconductor material grows directly on the sealing material. A partial trench is etched in a surface of the epitaxially grown semiconductor layer. This step is performed in such a way that at least part of the layer made of the sealing material is uncovered. An uncovered part of the layer made of the sealing material is then removed.

Embodiments of the present invention thus provide a method that can be used to fabricate trenches having particularly high aspect ratios in a semiconductor substrate by means of already developed technologies. Such trenches can be used in a variety of areas of application requiring trenches having particularly high aspect ratios. For example in the field of micromechanics or sensor technology, for example for fabricating subterranean, deep channel systems for liquids or gas streams.

The invention furthermore provides a method for fabricating a trench capacitor, having the steps of the method defined above for fabricating a trench and also the steps for providing a bottom capacitor electrode adjoining a wall of the trench, a storage dielectric and also a top capacitor electrode, which are in each case arranged at least partly in the trench.

Consequently, according to embodiments of the present invention, capacitor trenches are formed in a semiconductor substrate by method steps that are known in principle, the capacitor trenches being covered after cleaning in a suitable manner, so that the surface of the trenches is not exposed. In particular, at least one layer is provided on the trench wall, so that the topmost layer provided on the trench wall is constructed from a sealing material.

In a next step, after the removal of the residues of the trench etching mask, a selective epitaxy method is carried out, by means of which the substrate surface is epitaxially overgrown with a monocrystalline silicon. In other words, a smooth, closed epitaxial layer is produced on the substrate surface, the trenches etched in the substrate being completely retained. This is realized in particular by covering the trench walls in a suitable manner by virtue of the fact that the trench surface that is uncovered at the beginning of the selective epitaxy method is constructed from a sealing material which is not elementary silicon, that is to say monocrystalline silicon, polysilicon or amorphous silicon, nor is it a so-called silicon compound material such as, for example, SiGe or a silicide compound, nor is it a metallic material. Furthermore, the epitaxy method used is selective, so that a layer growth takes place only on the monocrystalline silicon regions.

To put it more precisely, a selective epitaxy method usually uses a gas mixture comprising, for example, silane or dichlorosilane and an etching gas such as HCl, for example. The selective epitaxy exploits the effect that the etching gas etches away the grown silicon at different speeds depending on the underlying material. Thus, in particular, the method parameters are set in such a way that the monocrystalline silicon material grown on silicon is etched away more slowly than the silicon growth rate, so that overall the silicon layer thickness formed on silicon increases. By contrast, the polycrystalline silicon seed layer forming on the sealing material, which is silicon oxide, for example, is etched away more rapidly than the silicon growth rate. As a consequence, silicon grows only on the monocrystalline surface regions, where an epitaxial monocrystalline silicon layer forms by virtue of the regions covered with the sealing material being laterally overgrown. The flow rate of dichlorosilane is usually 1.2 to 1.8 times the flow rate of HCl.

Partial trenches are subsequently produced by conventional methods in the epitaxially grown silicon layer, the partial trenches being linked to the trenches formed in the semiconductor substrate and being connected to the trenches. To put it more precisely, the trenches are etched, so that at least part of the layer made of the sealing material is uncovered.

By arbitrarily repeating the above-mentioned method steps, it is possible to fabricate trenches with an arbitrary depth. This makes it possible to fabricate capacitor trenches with particularly high aspect ratios by means of currently available technologies. Since already existing fabrication methods can be used, development costs can be saved. Furthermore, it is possible to achieve a higher capacitor capacitance without using temperature-sensitive materials, although the method according to the invention also includes the use of temperature-sensitive materials.

The method according to the invention can be embodied in various modifications. By way of example, after each step for etching a trench or partial trench, the bottom capacitor electrode, the dielectric layer and the top capacitor electrode may be provided in the etched trench or partial trench. Equally, however, it is also possible initially to leave the trench unfilled and to provide the capacitor electrodes and the dielectric layer only after the entire stack trench has been completed.

Furthermore, it is also possible, however, always to complete two or an arbitrary number of partial trenches or a trench and one or more partial trenches, and this is followed by the provision of the capacitor electrodes and also the dielectric layer for the completed trench stack, then the next epitaxial layer is applied, partial trenches are etched, and so on. In addition, the steps for forming the bottom capacitor electrode, the dielectric layer and the top capacitor electrode do not have to be effected directly in succession, rather they may be disposed according to expediency in the method sequence.

In the case where an empty trench is to be overgrown epitaxially, it is necessary to apply a thin covering layer made of a sealing material on the trench wall in order to prevent the epitaxially grown silicon material from growing on the trench wall.

As an alternative, however, it is also possible to introduce an arbitrary sacrificial material, which completely or else only partly fills the trench and is removed again from the trench stack or partial trench after the completion of the trench stack or partial trench. By way of example, the sacrificial material may comprise highly doped silicon oxide, which can be used to carry out a doping of the trench regions in a subsequent heat treatment step.

If, moreover, a capacitor electrode or a dielectric material is applied only after the trench stack has been completed, then it is possible, in this case, also to provide temperature-sensitive materials such as, for example, high-k dielectrics or metallic capacitor electrodes without a subsequent epitaxy step bringing about a thermal loading on these layers.

The thickness of the epitaxially grown layer is preferably less than the depth of the trench etched first in the semiconductor substrate. This affords the advantage that the etching sidewall of the trench etched in the epitaxially grown layer can be set in a targeted manner.

It is furthermore preferred for an upper partial trench to have a smaller diameter than an underlying partial trench. This affords the advantage that further elements of the memory cell, in particular the selection transistor and the bit line contact, can be accommodated in the topmost epitaxial layer. As a consequence, a capacitor having a higher capacitance can be formed with a lower space requirement.

Appropriate materials for the bottom or top capacitor electrode and the dielectric layer are those that are usually used. In particular, capacitor electrodes used may be highly doped polysilicon, metal electrodes with a doping layer adjoining the substrate, a stack of metal and barrier layers, the barrier layer being fabricated from an insulating material, being arranged between substrate and metal layer and being interrupted—usually in its lower region—in order to enable a contact between substrate and metal layer. In particular, metal silicide layers, in particular silicides comprising a metal having a high melting point, TiN, W, Co, Ta, Mo, or other metals having a high melting point, are appropriate as metallic electrode material.

Dielectric materials used may be, in particular, an $SiO_2$/$Si_3N_4$ layer stack or only $SiO_2$ or $Si_3N_4$, $Al_2O_3$, $TiO_2$, $Ta_2O_5$, or else other high-k dielectrics.

Each epitaxially grown layer may have a doping, which deviates for example from that of the layer formed underneath. The dopant concentration may be adapted to the desired electrical properties. In addition, in each partial trench, it is possible to use a material for the bottom or top capacitor electrode and the storage dielectric, which differs from that of the other partial trenches or the bottommost trench.

Embodiments of the invention are furthermore achieved by means of a trench capacitor that includes a bottom capacitor electrode, a capacitor dielectric and a top capacitor electrode, which are arranged at least partly in a trench, the bottom capacitor electrode adjoining a wall of the trench and the trench having a depth and also a smallest diameter, and a ratio of depth to smallest diameter being greater than 70, in particular greater than 80, and particularly preferably greater than or equal to 85.

Embodiments of the present invention thus provide a trench capacitor having a particularly high aspect ratio. To put it another way, a trench capacitor having a high storage capacitance can be provided together with a particularly small space requirement.

Capacitor trenches are usually formed such that they are oval, rather than circular, in plan view. In other words, they have two different diameters along two different sectional directions. If the trench etched in the semiconductor substrate and all the partial trenches have the same diameters, then the smallest diameter corresponds to the smallest diameter or the smallest width of all the partial trenches. By contrast, if the topmost partial trench has a smaller diameter than the underlying partial trenches at least in one direction, then the smallest diameter corresponds to the smallest diameter of the topmost partial trench.

According to a further aspect, the present invention provides a semiconductor substrate, comprising a first substrate portion made of a single crystalline semiconductor material, a second substrate portion made of a single crystalline semiconductor material, the second substrate portion defining a substrate surface; and a plurality of trenches extending in a direction perpendicular to the substrate surface, the trenches being formed in the first substrate portion.

In particular, the thickness of the second substrate portion can be 600 nm to 3000 nm, especially, 800 to 1500 nm.

BRIEF DESCRIPTION OF THE DRAWINGS

The present invention is explained in more detail below with reference to the accompanying drawings, in which.

Figure 1:
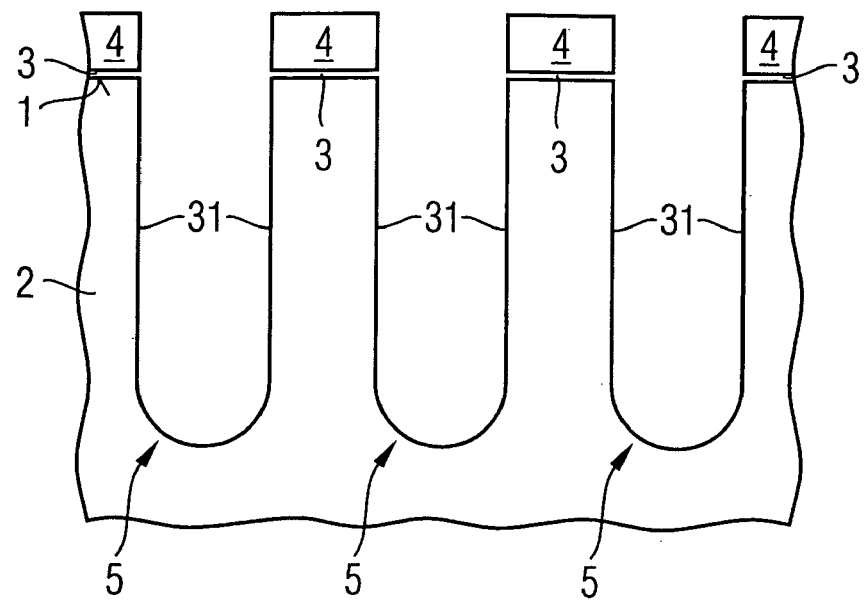
FIGS. 1-12 show steps for fabricating a trench capacitor in accordance with a first exemplary embodiment of the present invention.

The following list of reference symbols can be used in conjunction with the drawings.
1 Surface
2 Semiconductor substrate
3 $SiO_2$ layer
4 $Si_3N_4$ layer
5 Trench
6 $n^+$-doped region
6a Bottom capacitor electrode
7 Dielectric layer
8 Top capacitor electrode
9 Sealing layer
10 Epitaxial cavity
11 Selective epitaxial layer
12 BPSG layer
13 Photoresist layer
14 Spacer
15 $n^+$-doped region
16 Surface of the epitaxial layer
17 Insulation collar
18 Insulation structure
19 $n^+$-doped region
20 Polysilicon filling
21 Gate electrode
22A, 22B First and second source/drain region
23 Second epitaxial layer
24 Third epitaxial layer
25 Fourth epitaxial layer
26 Sacrificial layer
27 Covering layer
28 Trench capacitor
29 Selection transistor
30 Partial trench
31 Trench wall

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

In accordance with a first exemplary embodiment of the present invention, a trench capacitor having a total depth of about 11.8 µm is fabricated using an epitaxy step and two mask steps for defining the trench capacitors. In this case, the bottom capacitor electrode, the storage dielectric and the top capacitor electrode are provided directly after the etching in each case in each etched trench. It is evident, however, that in accordance with the present invention, first of all the trench can be fabricated in its entire depth and then the bottom capacitor electrode, the storage dielectric and the top capacitor electrode can be fabricated by known methods.

Referring now to FIG. 1, an oxide (e.g., $SiO_2$) layer 3 having a thickness of 3 nm and a nitride (e.g., $Si_3N_4$) layer 4 having a thickness of 220 nm are applied to a surface 1 of a semiconductor substrate 2. A BPSG layer (not illustrated) having a thickness of 620 nm is applied thereto. The specific thicknesses provided herein are by way of example and it is understood that other thicknesses could be used.

Using a mask (not illustrated) produced photolithographically, the BPSG layer, the $Si_3N_4$ layer 4 and the $SiO_2$ layer 3 are patterned, e.g., in a plasma etching process using $CF_4$/$CHF_3$, thereby forming a hard mask. Using this hard mask as an etching mask, trenches 5 are etched into the main area 1, e.g., in a further plasma etching process using $HBr/NF_3$. A trench wall 31 is uncovered within each trench 5. Afterward, the BPSG layer is removed, e.g., by means of a wet etching using $H_2SO_4/HF$.

The trenches 5 have for example a depth of about 6.6 μm, a width of about 100' 250 nm and a distance between one another of 100 nm. The construction illustrated in FIG. 1 is produced.

Figure 2:
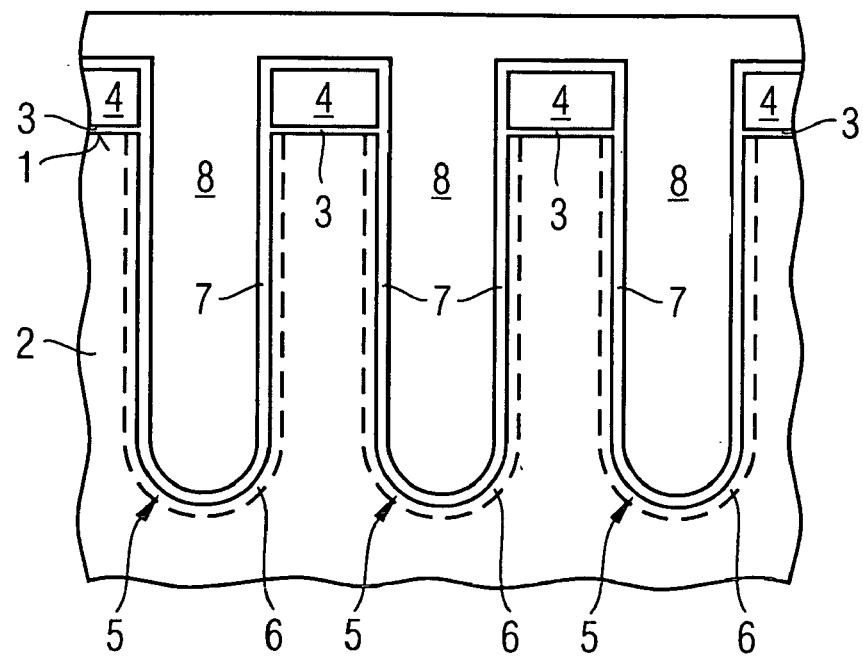

In a next step, the bottom capacitor electrode 6a is fabricated by fabricating an n+-doped region 6. As shown in FIG. 2, this may be done for example by deposition of an arsenic-doped silicate glass layer with a layer thickness of 50 nm and of a TEOS-$SiO_2$ layer with a thickness of 20 nm and a subsequent heat treatment step at 1000° C., 120 seconds. In this case, an n+-doped region 6, which acts as a bottom capacitor electrode 6a of an individual capacitor in the finished memory cell arrangement, is formed by outdiffusion from the arsenic-doped silicate glass layer in the semiconductor substrate 2. As an alternative, a gas phase doping may also be carried out, e.g., with the following parameters: 900° C., 3 torr tributylarsine (TBA) [33%], 12 minutes.

The arsenic-doped silicate glass layer and the TEOS-$SiO_2$ layer are removed, e.g., again in an etching step using $NH_4F/HF$, which is selective with respect to $Si_3N_4$ and silicon.

Afterward, an $Si_3N_4$ layer having a thickness of 4.7 nm and an $SiO_2$ layer having a thickness of 1.5 nm are deposited as dielectric layer 7. As an alternative, the dielectric layer 7 contains $Al_2O_3$, $TiO_2$, $Ta_2O_5$ or other known dielectric materials. An in-situ doped polysilicon layer 8 having a thickness of 300 nm is subsequently deposited as a top capacitor electrode. The construction shown in FIG. 2 is produced. Afterward, the polysilicon layer 8 is planarized by chemical mechanical polishing.

Figure 3:
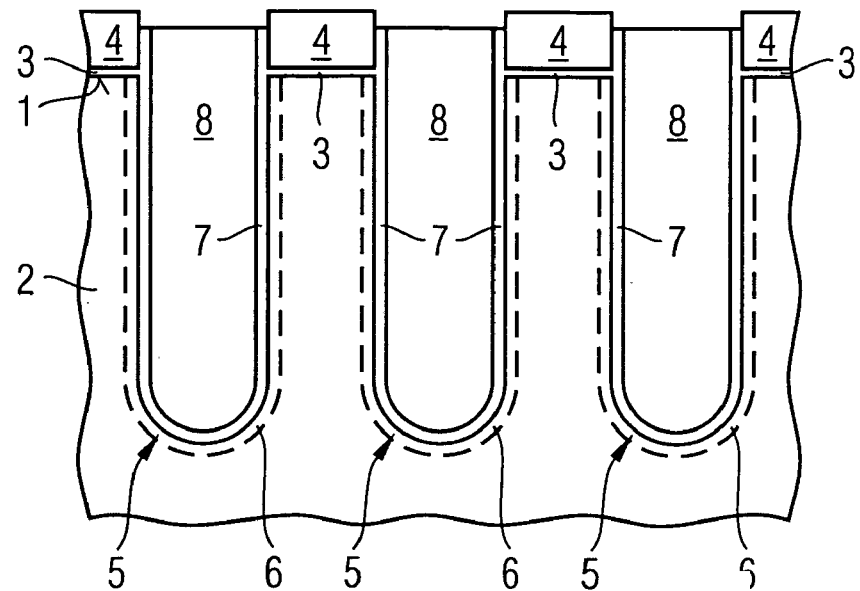
Figure 4:
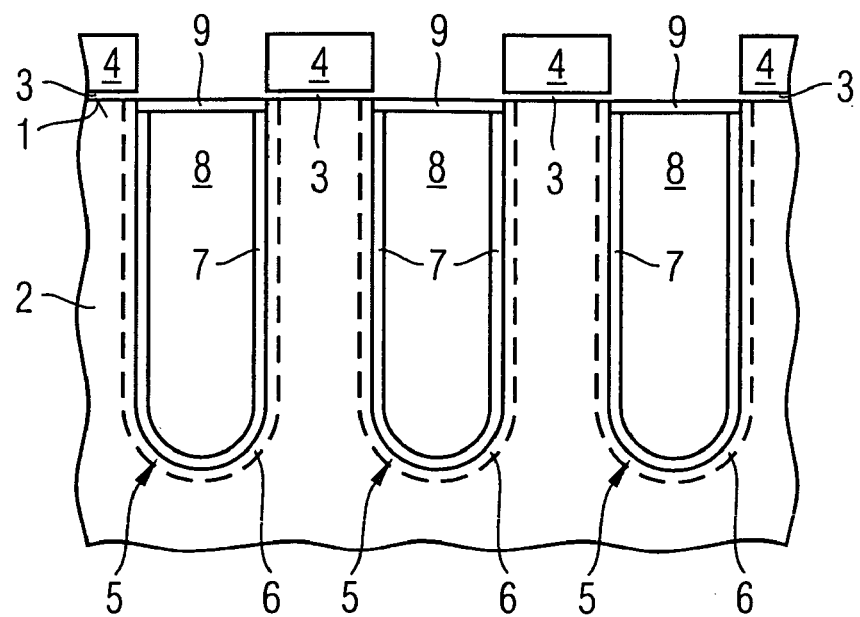
Figure 5:
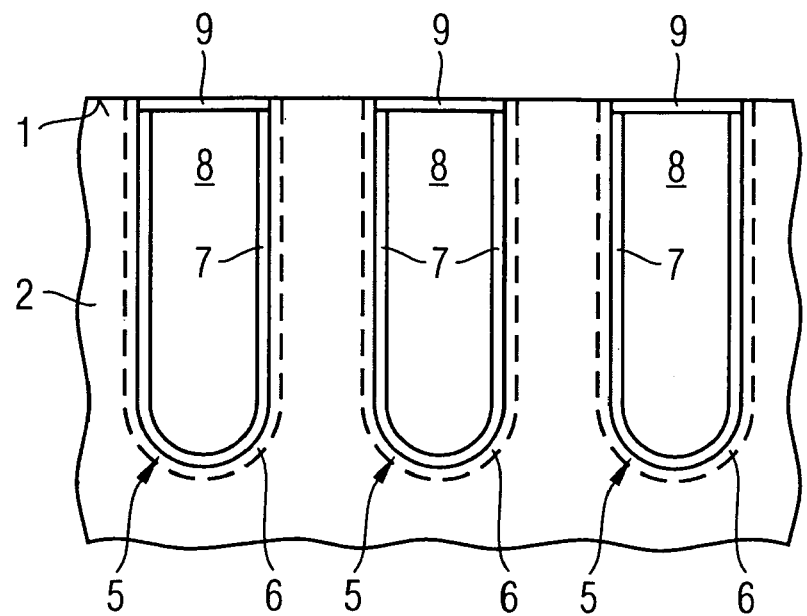

Referring now to FIG. 3, the polysilicon filling 8 is etched back by 10 nm below the surface 1 of the semiconductor substrate 2. This step can be performed, for example, by means of etching using $SF_6$. A sealing layer 9, for example made of $SiO_2$, is subsequently provided on the surface of the trench filling, as shown in FIG. 4. This may be done for example by thermal oxidation of the filling layer. In this case, the thickness of the sealing layer 9 is 12 nm. As an alternative, by means of an HDP method, it is also possible for an $SiO_2$ layer to be deposited and then etched back. In this case, the resulting layer thickness is approximately 15 nm. Afterward, the residues of the hard mask 4 are removed by known methods and the construction shown in FIG. 5 is produced.

Figure 6:
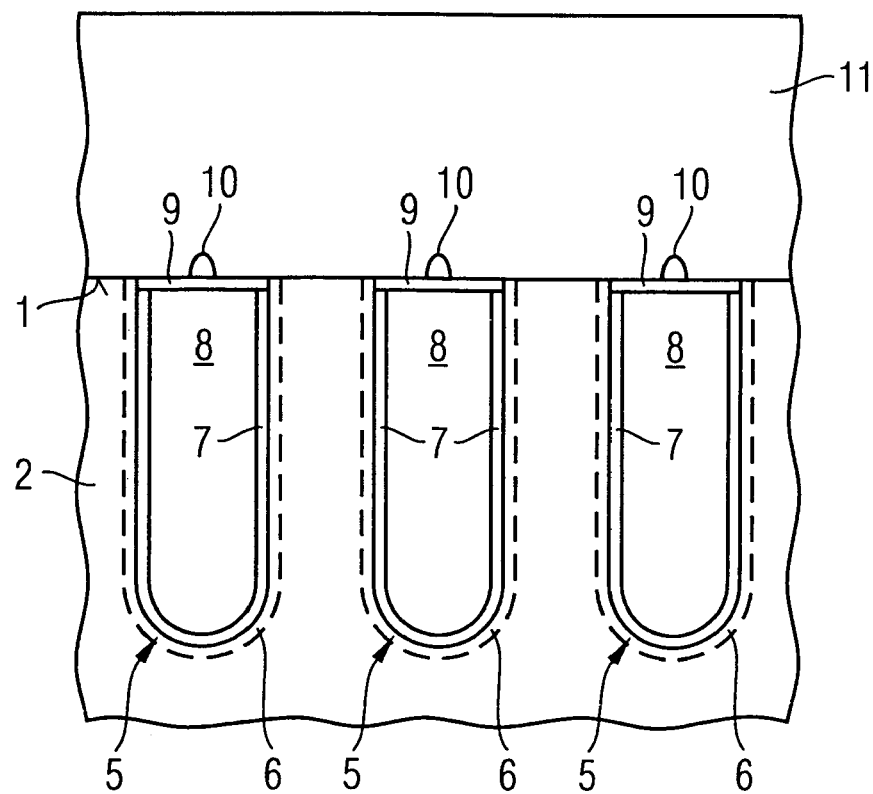

As is shown in FIG. 6, a selective epitaxy method is subsequently carried out, by means of which monocrystalline silicon is grown with a layer thickness of 5 μm, for example, on the substrate surface 1. By way of example, the epitaxy method may be a CVD method using dichlorosilane at a flow rate of 180 sccm (cubic centimeters per minute under standard conditions) and HCl with a flow rate of 60 sccm at 900° C. In this case, an epitaxial cavity 10 forms in the center of each sealing layer 9.

In particular, as can be seen from FIG. 6, there is provided a semiconductor substrate, comprising a first substrate portion 2 made of a single crystalline semiconductor material, a second substrate portion 11 made of a single crystalline semiconductor material, the second substrate portion 11, which is the epitaxial layer, being disposed on top of the first portion, and a surface of the second substrate portion defining a substrate surface; and a plurality of trenches 5 extending in a direction perpendicular to the substrate surface, the trenches 5 being formed in the first substrate portion 2. In particular, the second substrate portion can have a thickness of 600 nm to 3 μm, especially from 800 nm to 1.5 μm.

The epitaxially deposited silicon layer 11 is subsequently patterned according to known methods, and trenches adjoining the previously etched trenches are etched.

Figure 7:
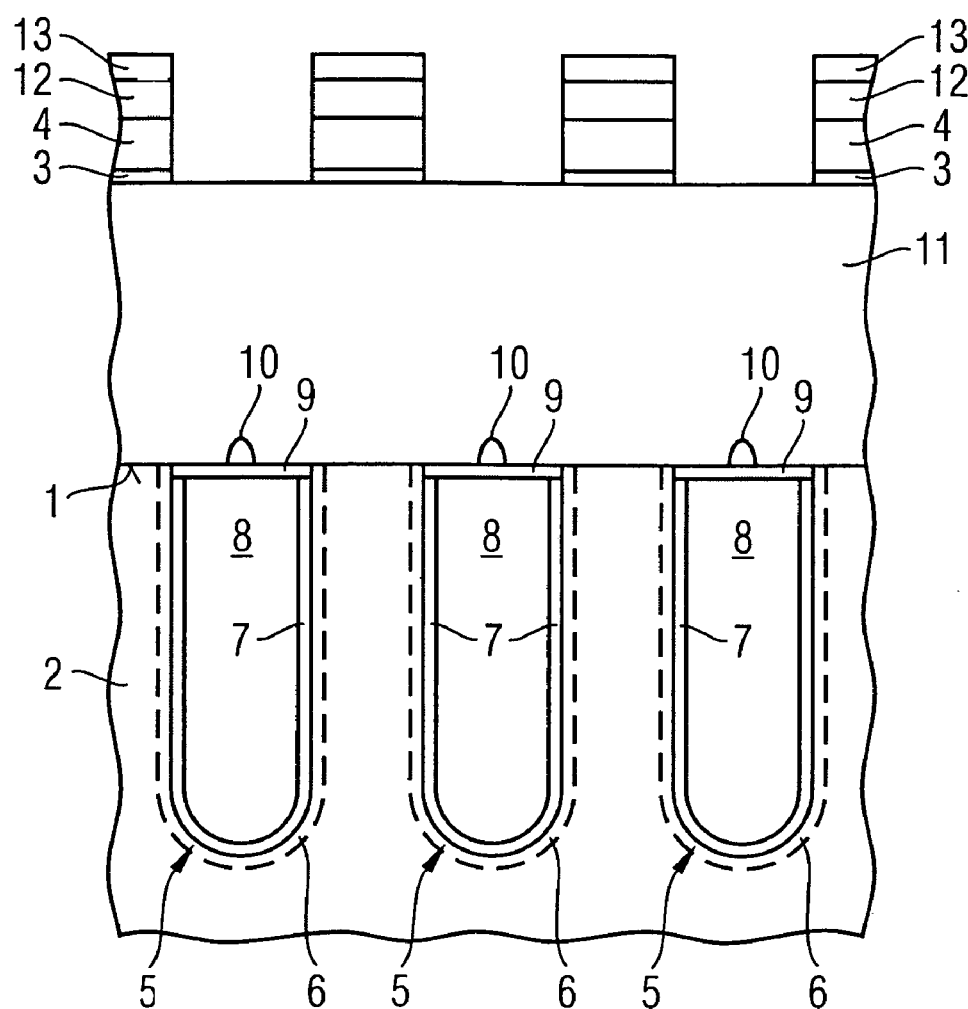

Firstly, as is shown in FIG. 7, an $SiO_2$ layer 3 having a thickness of 3 nm and an $Si_3N_4$ layer 4 having a thickness of 220 nm are once again applied on a surface 16 of the selectively grown epitaxial layer 11. A BPSG layer 12 having a thickness of 620 nm is applied thereto. Afterward, a photoresist layer 13 is applied according to known methods.

The mask, which was also used for the patterning of the first trench, can be used for the exposure of the photoresist layer 13. However, it is also possible to use a photo mask having smaller openings. The alignment with respect to the underlying trench structures 5 is preferably effected by means of special alignment marks.

Figure 8:
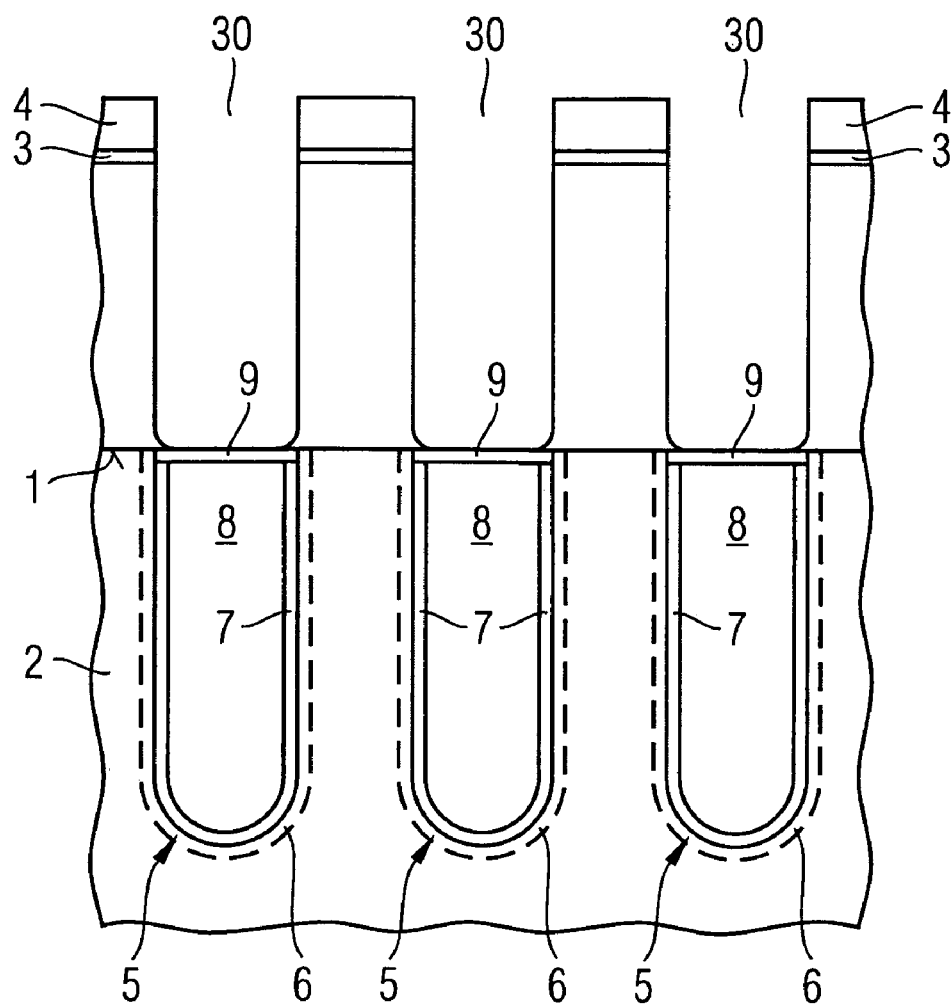
Figure 9:
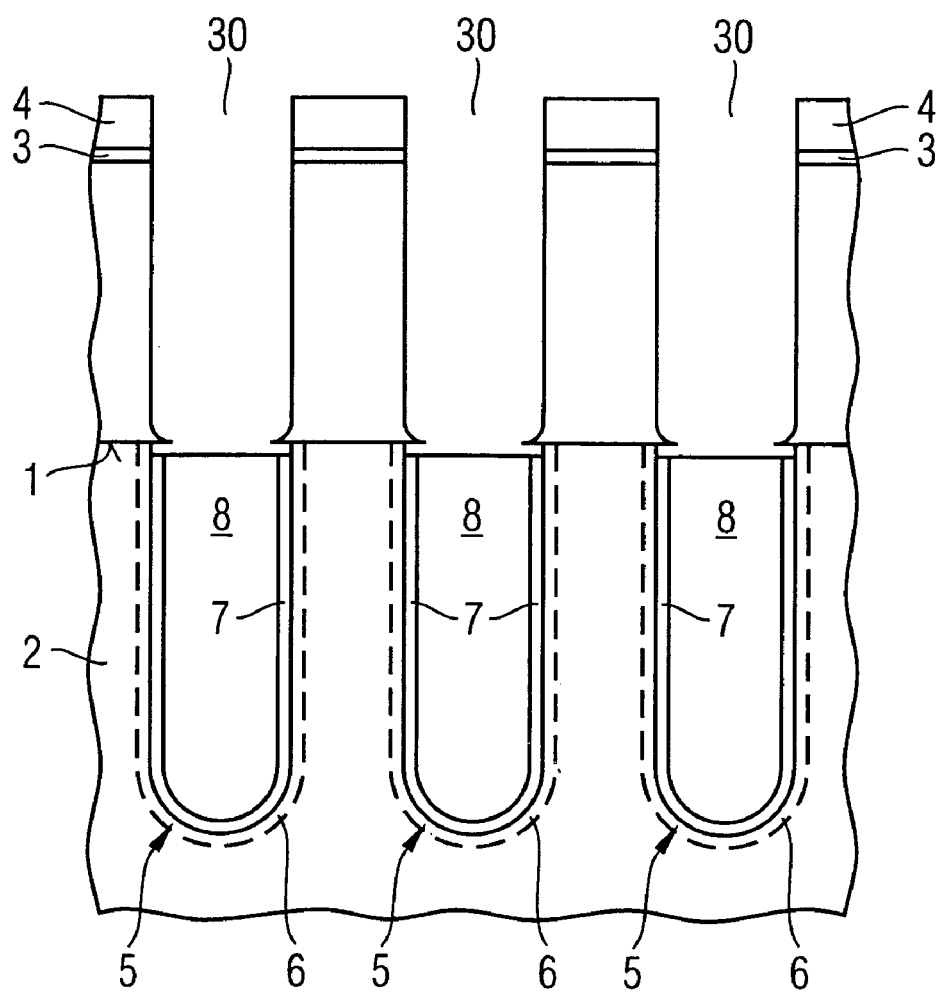

After the photolithographic patterning of the hard mask layers and the removal of the photoresist layer 13, the trench mask is subsequently transferred into the epitaxial layer 11 by means of selective RIE trench etching, the etching of the trench stopping on the sealing layer 9 of the completed trenches 5 situated underneath. Si is etched selectively with respect to SiO2. The construction shown in FIG. 8 is produced. Afterward, the sealing layer 9 is removed, e.g., using DHF (dilute hydrofluoric acid), so that the construction shown in FIG. 9 is produced.

Afterward, the bottom capacitor electrode and the storage dielectric are produced in the etched partial trench in an analogous manner to that described above with reference to FIG. 2. However, during the formation of the bottom capacitor electrode, it is necessary, as is generally customary, to take account of a covering of the upper partial trench region, in which the insulation collar is formed later, in order to avoid a doping of the partial trench region.

Figure 10:
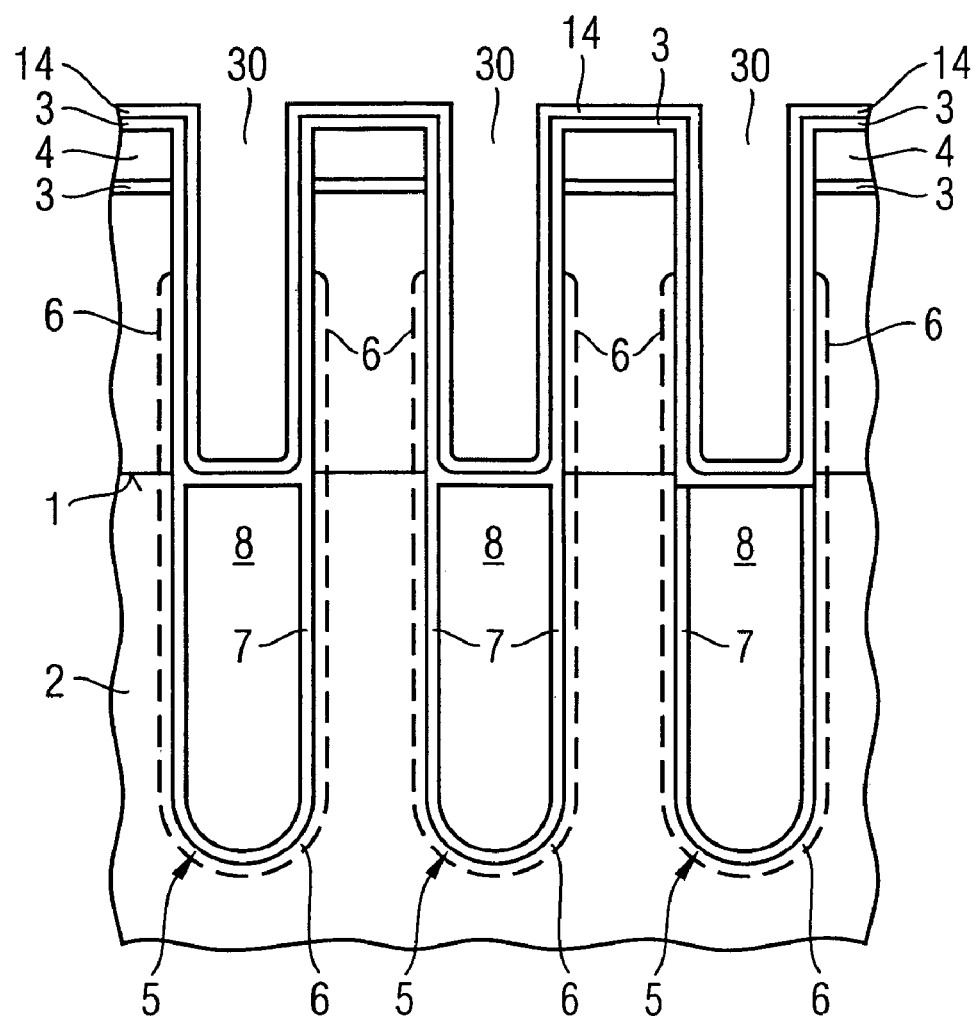

As an alternative, it is possible of course, to produce the bottom capacitor electrode and the storage dielectric by means of alternative methods that, however, are also generally known. Afterward, a spacer material 14, for example made of a Si (e.g., amorphous silicon), is deposited conformally with a thickness of approximately 15 nm to 20 nm. This is illustrated in FIG. 10.

Figure 11:
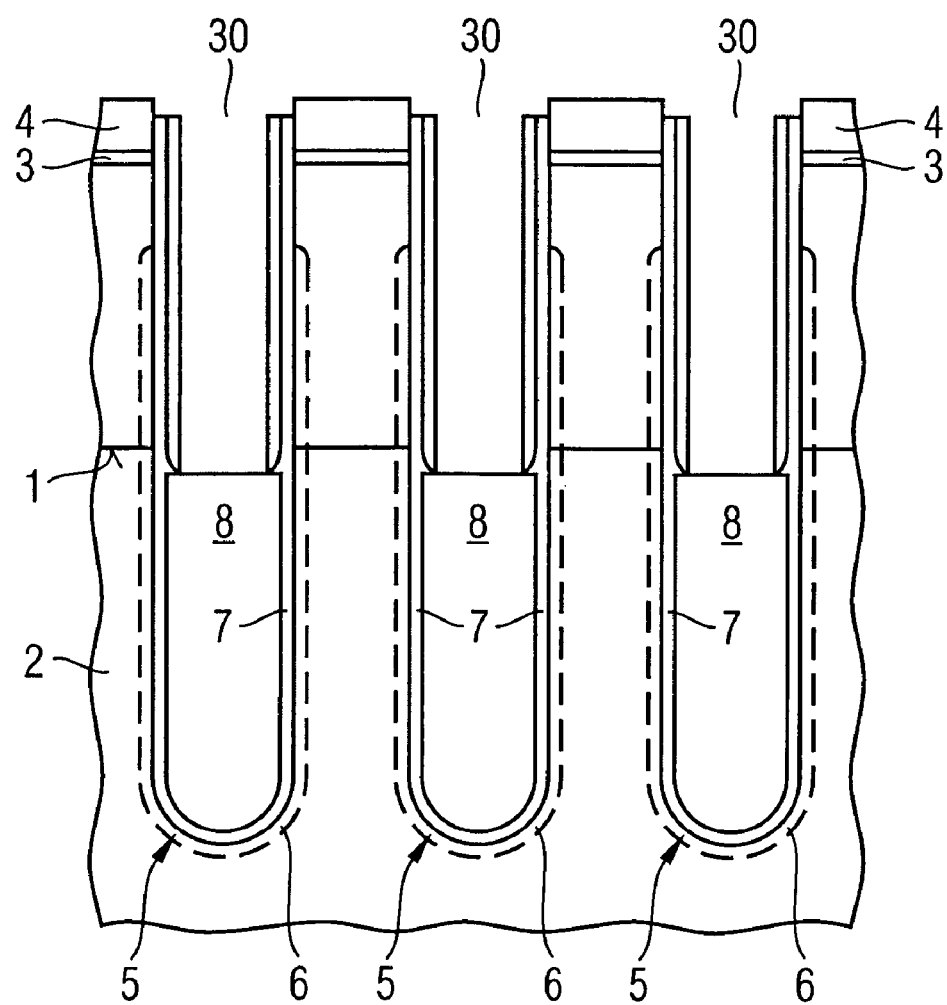

As is shown in FIG. 11, the spacer layer 14 and the storage dielectric layer 7 are removed at the bottom of the partial trench 5 by means of an RIE method (reactive ion etching). During this spacer RIE method, the dielectric layer 7 at the vertical sidewalls of the trench 5 is protected by the spacer layer 14. After cleaning and preferably selective wet-chemical etching of the spacer layer 14, the trenches 5 in the epitaxial layer 11 are filled with a further polysilicon layer 8 with a layer thickness of 300 nm. The construction shown in FIG. 12 is produced.

Figure 12:
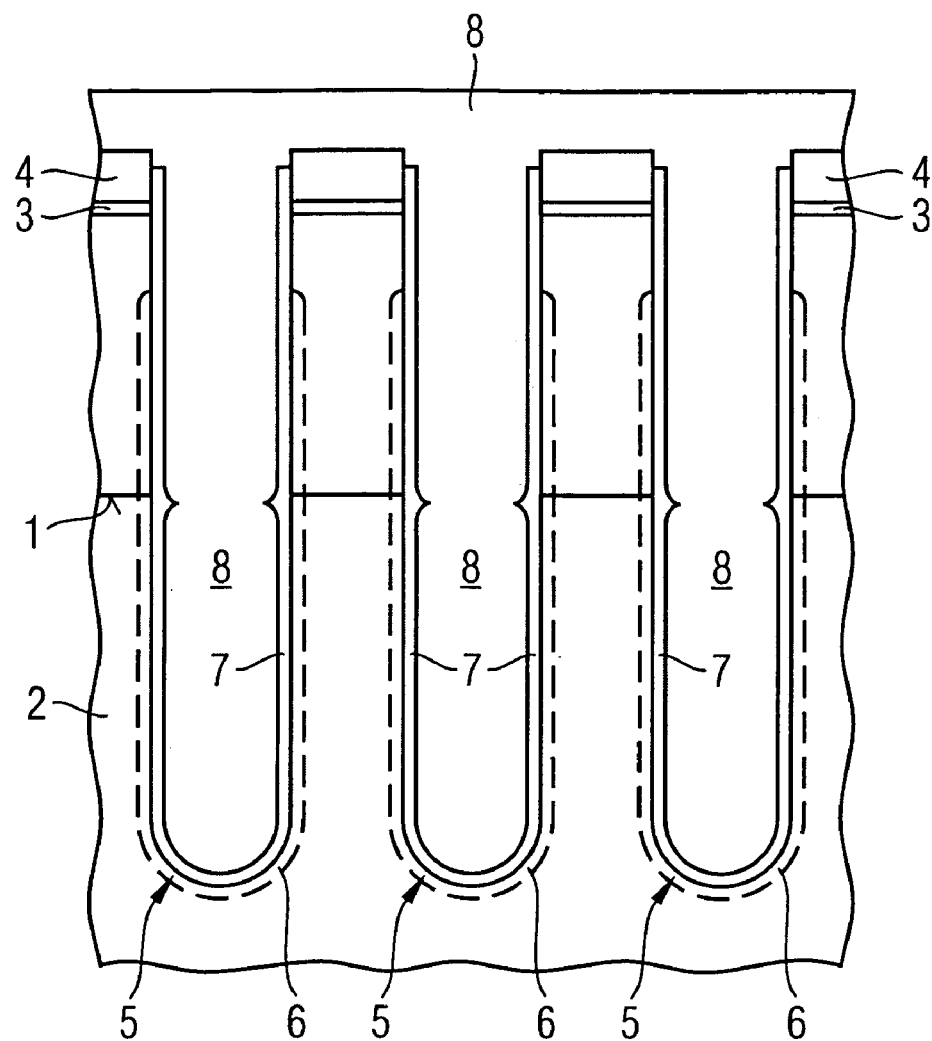

As is shown in FIG. 12, the trenches 5 are formed with a large depth in the silicon substrate and the monocrystalline silicon applied epitaxially thereto. The bottom capacitor electrode 6 of the two trench regions is formed in continuous fashion; in the case of the dielectric layer 7 and the top capacitor electrode 8, there are overlap and contact locations at the trench transition, but these do not impair the functioning of the trench capacitor.

The further method steps for fabricating a storage capacitor and a selection transistor linked thereto for a conventional memory cell construction are explained below. These method steps and the memory cell construction are generally known and are presented only for the sake of completeness. It is evident that the trench capacitor according to the invention can also be realized by means of arbitrary other cell concepts.

Figure 13:
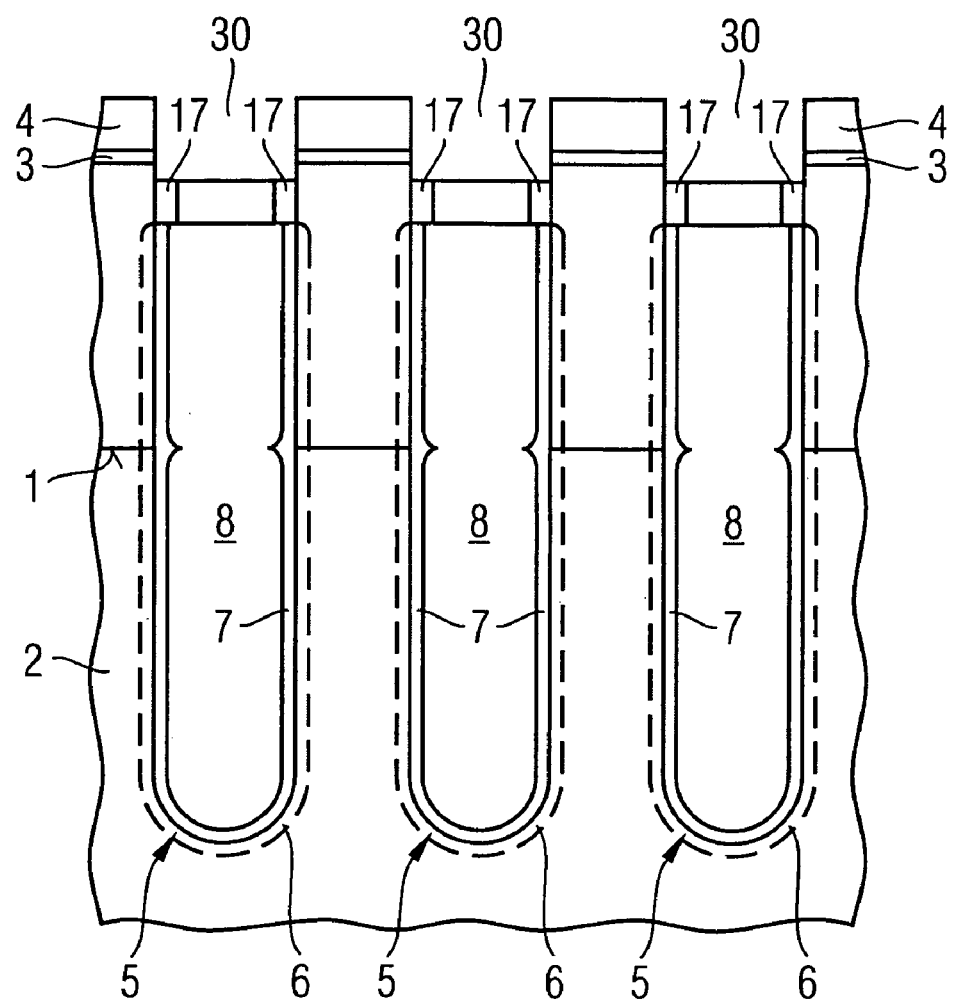
FIG. 13 shows a further step in the method for fabricating a memory cell.

As is illustrated in FIG. 13, in a next step, the polysilicon filling 8 is etched back to approximately 0.9 μm below the surface of the epitaxial layer 16. Afterward, for defining the depth of the insulation collar, the dielectric layer is etched away at the uncovered sidewalls of the trenches by known methods. Afterward, an $SiO_2$ layer is deposited conformally with a layer thickness of 25 nm. The deposited $SiO_2$ layer 17 is then etched anisotropically, thereby fabricating the $SiO_2$ insulation collar in the upper part of the trenches. The task of the insulation collar 17 is to suppress a parasitic transistor, which would otherwise form at this location.

Afterward, an n+-type polysilicon layer is deposited, thereby filling the trenches of the storage capacitors in the collar region. In order to prepare for the buried contacts that are subsequently to be fabricated, the polysilicon is etched back to approximately 120 nm below the surface of the epitaxial layer 11. The construction illustrated in FIG. 13 is produced.

In order to uncover the buried contact areas, the $SiO_2$ collar region 17 is etched away in the upper region.

In order to complete the buried contacts, after nitriding of the open silicon surfaces, an n+-type polysilicon layer is then once again deposited and planarized by chemical mechanical polishing to the surface of the $Si_3N_4$ layer 4. The deposited polysilicon layer is etched back to approximately 40 nm below the surface 16 of the epitaxial layer 11 (recess 3 etching).

For defining active regions, insulation structures 18 which laterally delimit the active regions are subsequently produced. For this purpose, a mask (not illustrated) produced photolithographically is formed, which mask covers the active regions. A non-selective etching step using $CHF_3/N_2/NF_3$ ensues, in the course of which $Si_3N_4$, $SiO_2$ and polysilicon are etched. In this case, the etching depth corresponds to the depth of the trench insulation. Afterward, the photoresist mask is removed. A thin thermal $SiO_2$ layer is subsequently produced on silicon by oxidation.

An HDP deposition (high density plasma method) of $SiO_2$ with a thickness of 250 nm ensues. By means of chemical mechanical polishing to the surface of the $Si_3N_4$ layer 4, an etching step using $H_3PO_4$, which attacks $Si_3N_4$, and an etching step using DHF, which attacks $SiO_2$, the insulation structure 18 is completed and the layers of the hard mask, the $Si_3N_4$ layer 4 and the $SiO_2$ layer 3 are removed.

A screen oxide is subsequently formed by means of a sacrificial oxidation. Photolithographically produced masks and implantations are used for forming n-doped wells, p-doped wells and for carrying out threshold voltage implantations in the region of the periphery and the selection transistors of the cell array. Furthermore, high-energy ion implantation is carried out (so-called "Buried-Well-Implant") in order to form an n+-doped region 15, which connects adjacent bottom capacitor electrodes 6 to one another.

The transistor is subsequently completed by generally known method steps by respectively defining the gate oxide and also the gate electrodes 21, corresponding interconnects and also the source/drain electrodes 22. The memory cell arrangement is then completed in a known manner by the formation of further metallization planes.

Figure 14:
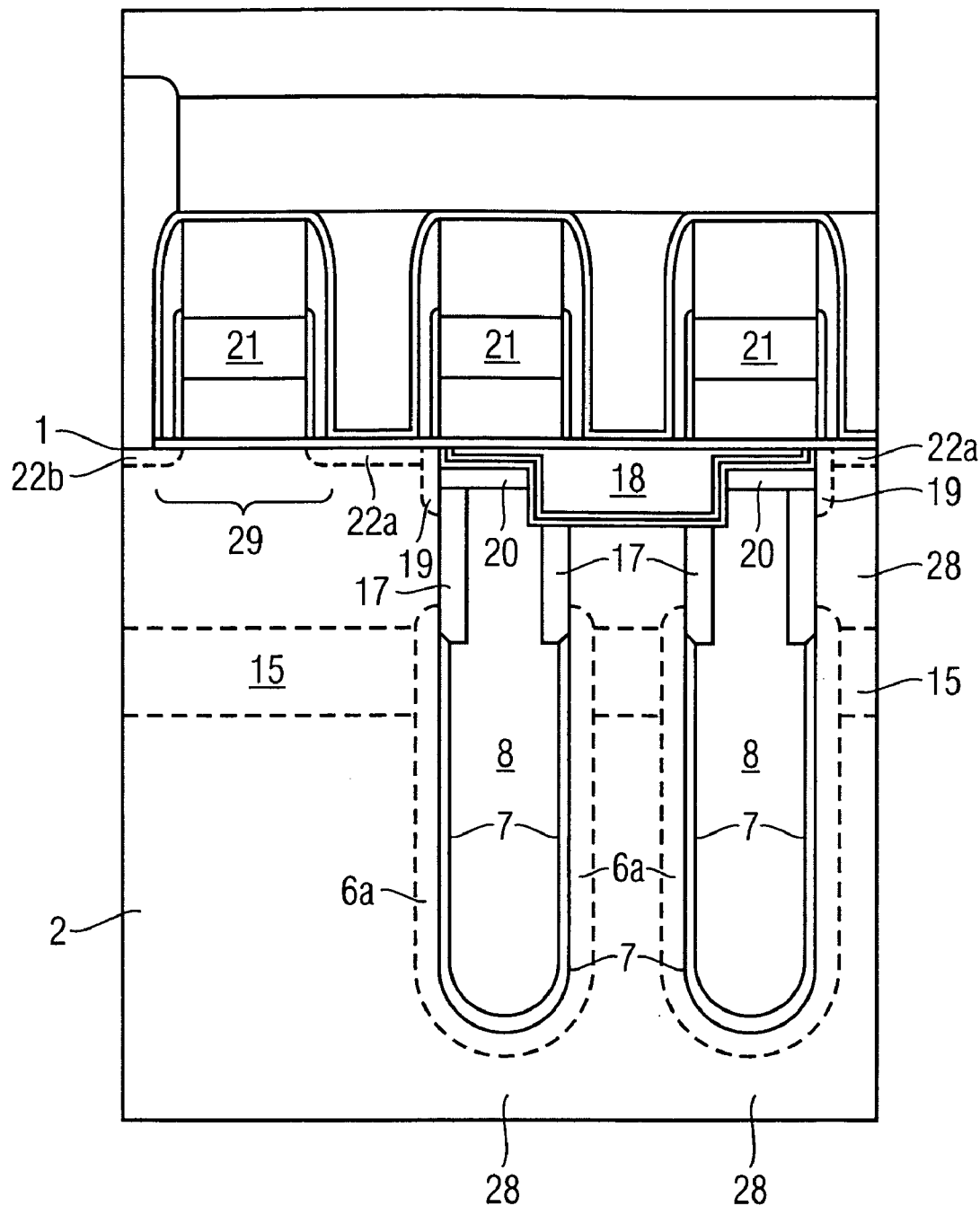
FIG. 14 shows a diagrammatic cross-sectional view of the essential components of a finished memory cell in accordance with the first embodiment.

FIG. 14 shows a diagrammatic illustration of the resulting memory cell. The trench capacitors 28 with bottom capacitor electrode 6a, storage dielectric 7 and top capacitor electrode 8, embodied as a polysilicon filling, are arranged in each case in the trenches 5. The top capacitor electrode 8 is connected to the first source/drain electrode of the selection transistor 29 via the polysilicon region 20 and the doped region 19. The conductivity of the conductive channel that forms between first and second source/drain electrodes 22a, 22b is controlled via the gate electrode 21.

Figure 15:
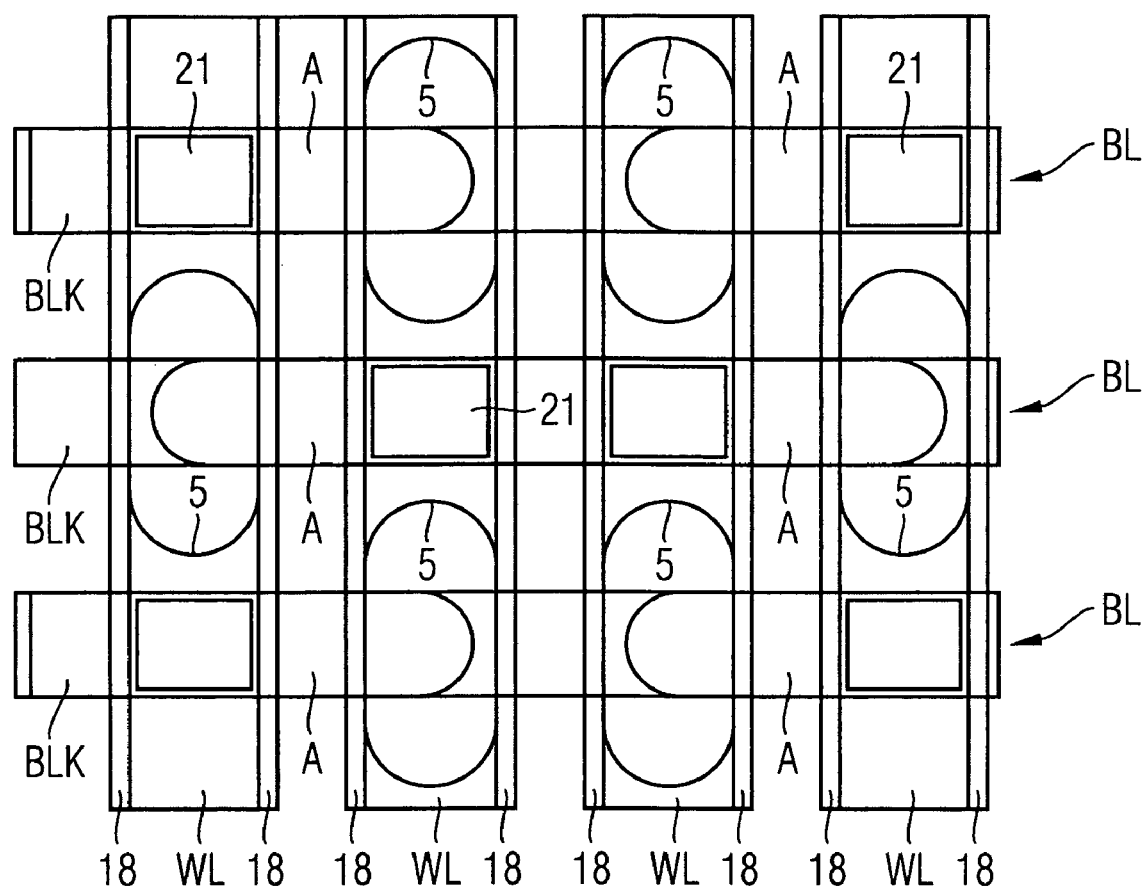
FIG. 15 shows a layout in an 8 F2 cell architecture.

FIG. 15 shows by way of example a layout for an 8 F2 cell architecture of the memory cells described. The memory cell arrangement has, per memory cell, a storage capacitor arranged in one of the trenches 5 and a planar selection transistor. A space requirement of 8 F2 is necessary per memory cell, where F is the smallest feature size that can be fabricated in the respective technology. The bit lines BL run in strip form and parallel to one another in plan view, the width of the bit line BL in each case being F and their distance between one another likewise being F. The word lines WL run perpendicular thereto in plan view and likewise have a width of F and a distance between one another of F. Active regions A are arranged below the word lines WL and bit lines BL, two word lines WL crossing above each active region. The active regions A are arranged such that they are in each case offset with respect to one another below adjacent bit lines BL. A bit line contact BLK is arranged in the center of the active regions A and enables an electrical connection between the respective bit line BL and the active region A. The trenches 5 are in each case arranged below the word lines WL. Within the active regions, the gate electrode 21 of the associated selection transistor is in each case formed at the crossover point between one of the bit lines BL and one of the word lines WL.

The active regions A in each case extend between two trenches 5. They comprise two selection transistors connected to the associated bit line BL via a common bit line contact BLK. Depending on which of the word lines WL is driven, the information is read out from the storage capacitor situated in one or the other of the trenches 5.

In accordance with a second exemplary embodiment of the present invention, a trench capacitor having a total depth of 22.4 μm is fabricated. For this purpose, the above-described method for epitaxially growing a silicon layer is carried out four times in total after the definition of the bottommost capacitor trenches 5. It is evident, however, that the epitaxy method can be carried out as often as necessary, depending on the requirement. In the case of the second exemplary embodiment described, firstly the lower four trench sections are fabricated, then the bottom capacitor electrode 26 is fabricated, the dielectric layer 7 is formed, and the top capacitor electrode 8 is fabricated. The fourth epitaxial layer 25 is subsequently applied after the fabrication of the sealing layer. The partial trench 5 formed in the fourth epitaxial layer 25 has a smaller cross section than the underlying trench regions. This is advantageous since the area of the capacitors can thereby be drastically reduced with the capacitor capacitance remaining the same. It is evident, however, that the measures described here can also be employed in the first embodiment.

Figure 16:
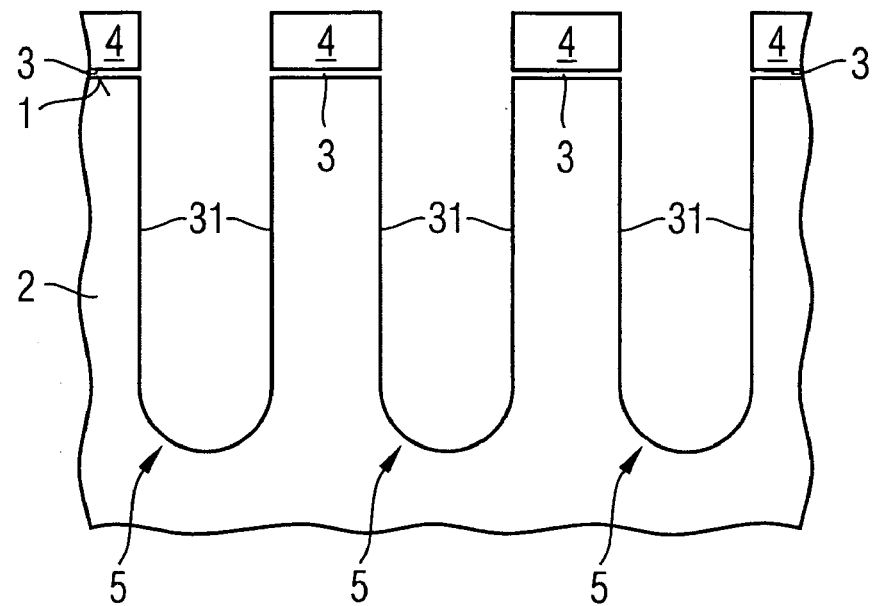
FIGS. 16-26 show steps for fabricating a trench capacitor in accordance with a second exemplary embodiment of the present invention.

The capacitor trenches 5 shown in FIG. 16 are fabricated in the same way as is shown in FIG. 1, a trench wall 31 being uncovered in each trench. However, they have a depth of 5.2 μm, a width of 200' 200 nm and are at a distance of 60 nm.

Figure 17A:
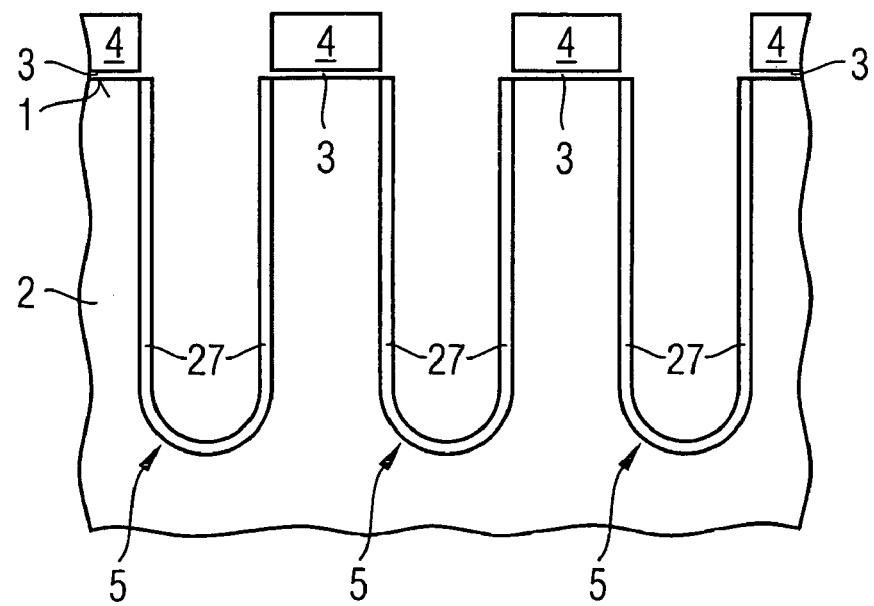

After the trenches 5 have been cleaned, a covering layer 27 is formed on the trench wall by thermal oxidation, in particular, with a thickness of 12 nm, for example. The covering layer 27 serves as protection during the subsequent selective epitaxy method in order to prevent the silicon from growing epitaxially on the inner walls of the capacitor trenches 5. Furthermore, the covering layer 27 serves as an etching stop during the method—that is subsequently to be carried out—for etching the capacitor trenches in the upper epitaxial layer 11. The construction shown in FIG. 17A is produced.

After the application of the covering layer 27, the hard mask layers, comprising the $SiO_2$ layer 3 and the $Si_3N_4$ layer 4 as in the first exemplary embodiment, are removed and the selective epitaxy method for growing monocrystalline silicon is carried out as in the first exemplary embodiment. In particular, a CVD method is carried out at 900° C. using dichlorosilane at a flow rate of 180 sccm and HCl at a flow rate of 60 sccm, as a result of which a silicon layer 11 having a thickness of 4.3 μm is deposited.

This epitaxial layer 11 laterally overgrows the open trenches 5, the latter being completely retained as cavities. To put it more precisely, a monocrystalline layer is also formed above the non-filled trenches. The construction shown in FIG. 18 is produced.

Figure 18:
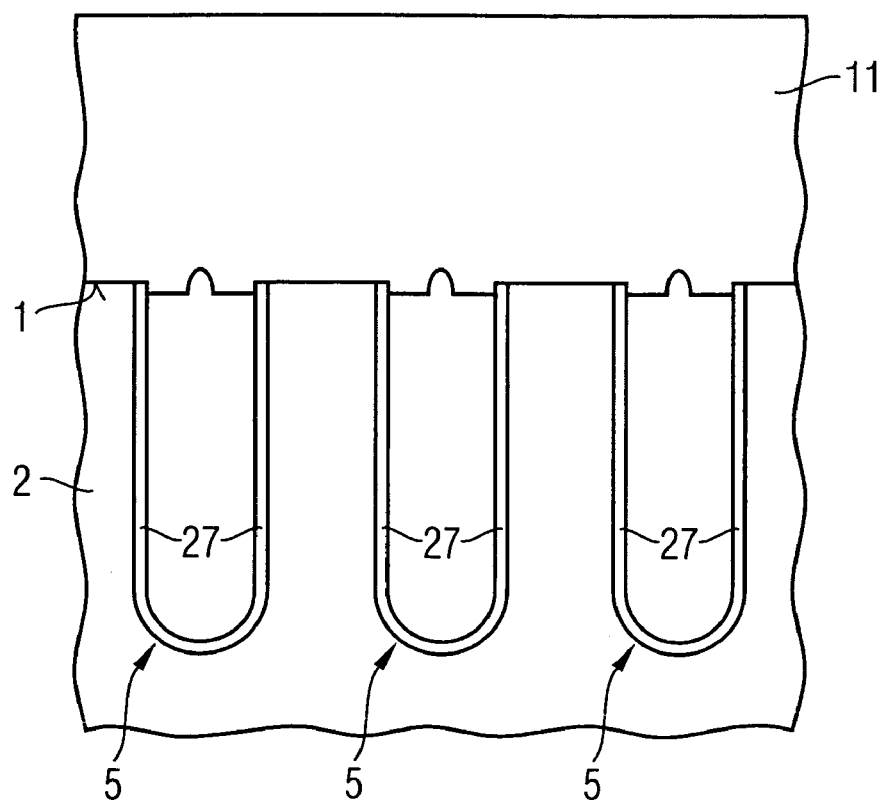

In particular, as can be seen from FIG. 18, there is provided a semiconductor substrate, comprising a first substrate portion 2 made of a single crystalline semiconductor material, a second substrate portion 11 made of a single crystalline semiconductor material, the second substrate portion 11, which is the epitaxial layer, being disposed on top of the first portion, and a surface of the second substrate portion defining a substrate surface; and a plurality of trenches 5 extending in a direction perpendicular to the substrate surface, the trenches 5 being formed in the first substrate portion 2.

Figure 19:
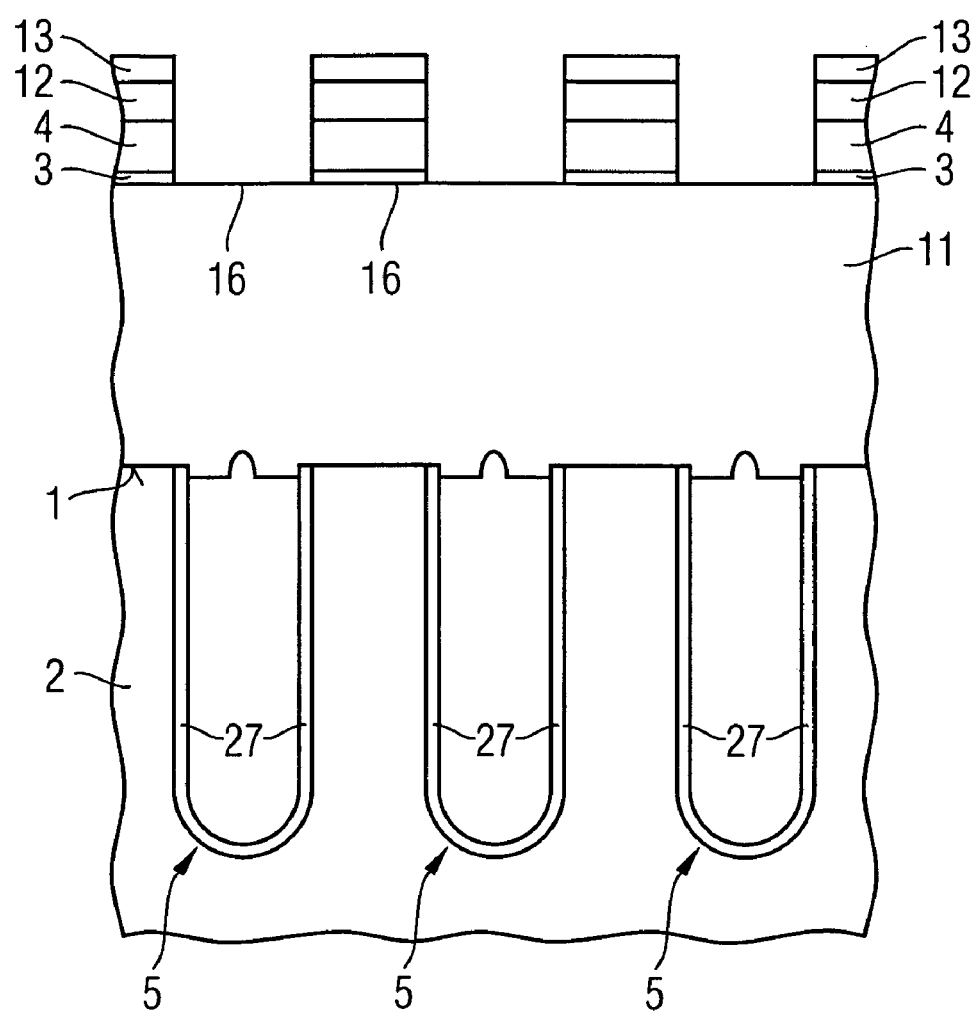

The epitaxially grown layer 11 is subsequently patterned analogously to the methods described above. In particular, the $SiO_2$ layer 3, the $Si_3N_4$ layer 4 and the BPSG layer 12 are again applied as hard mask layers, a photoresist layer 13 is applied and exposed using a trench mask after suitable alignment. The construction shown in FIG. 19 is produced after the patterning of the hard mask.

Figure 20:
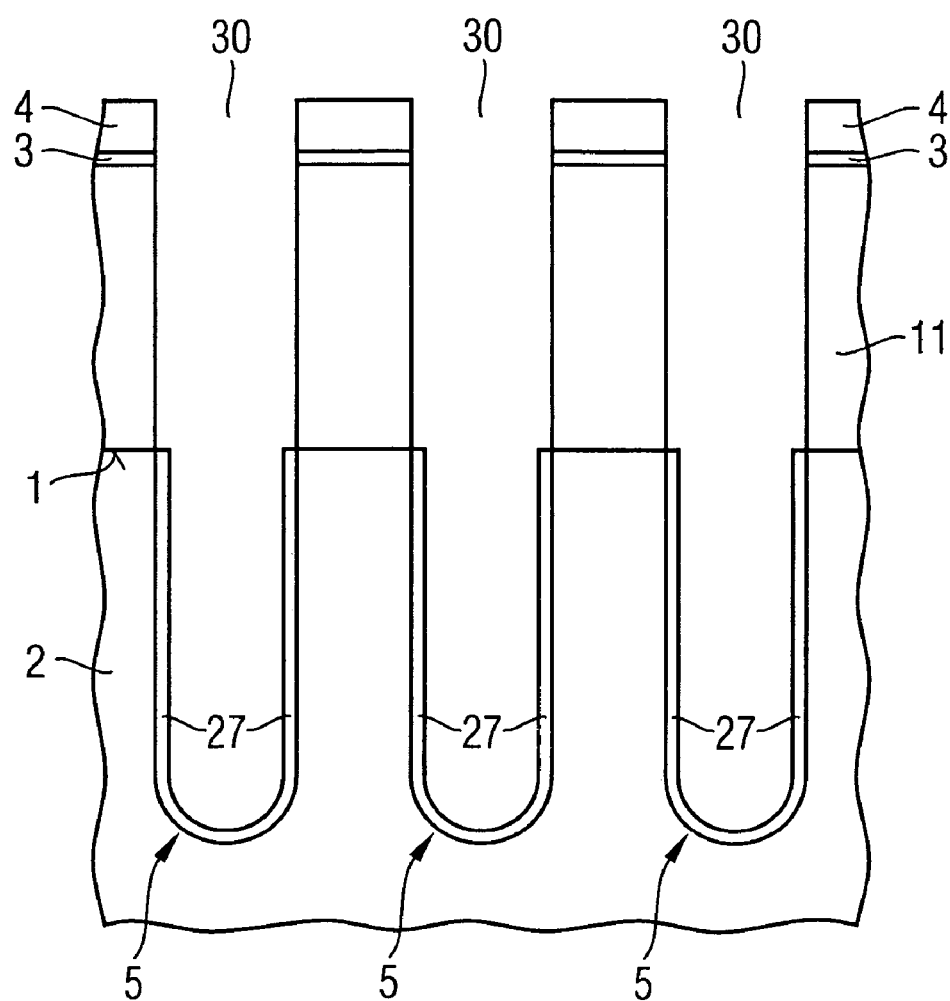

The trenches are etched in the epitaxial layer 11 by means of a selective RIE etching method, the etching stopping on the covering layer 27 of the underlying capacitor trenches. This is illustrated in FIG. 20.

Figure 21:
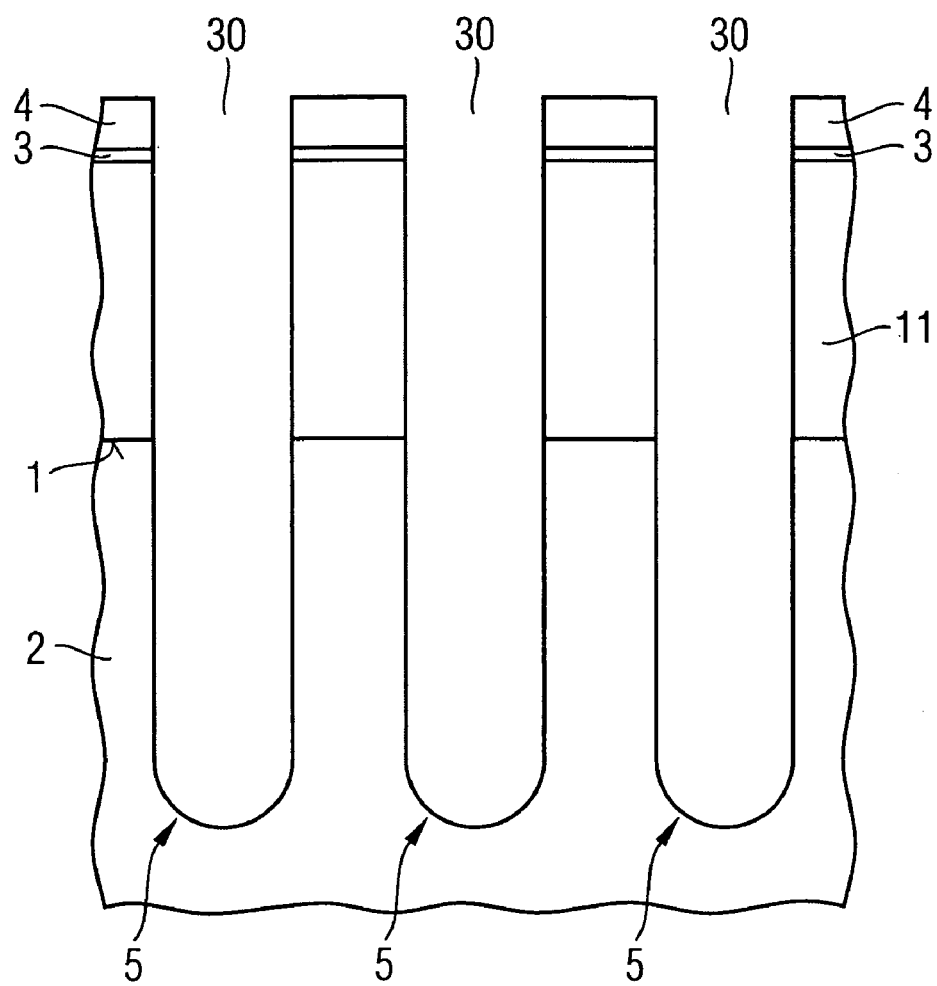

Removal of the covering layer 27, for example by etching using DHF (dilute hydrofluoric acid), produces the construction shown in FIG. 21.

Afterward, a new covering layer 27 is formed on the entire trench wall 31 formed previously. After the removal of the residual hard mask layers 3, 4, a CVD method is again carried out, as a result of which a further selective epitaxial layer 23 is formed with a thickness of 4.3 μm on the epitaxial layer 11.

Figure 22:
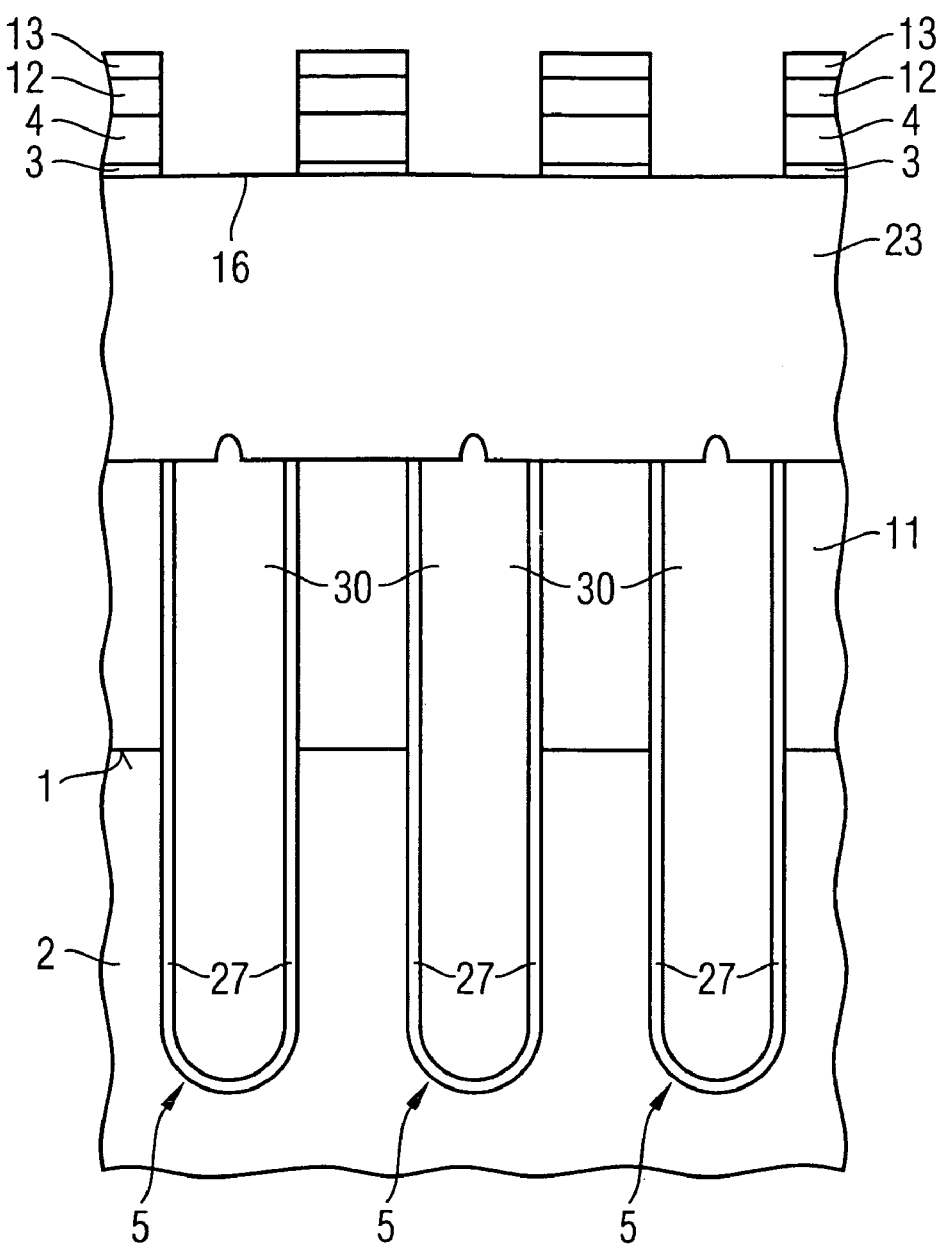

The second epitaxial layer 23 is also patterned in the manner described above, the trench diameter in the epitaxial layer 11, the epitaxial layer 23 and the silicon substrate 2 being identical in each case. The construction shown in FIG. 22 is produced after the patterning of the hard mask for the capacitor trenches 5. The partial trenches are then etched in the second epitaxial layer 23 in the manner described above.

Figure 23:
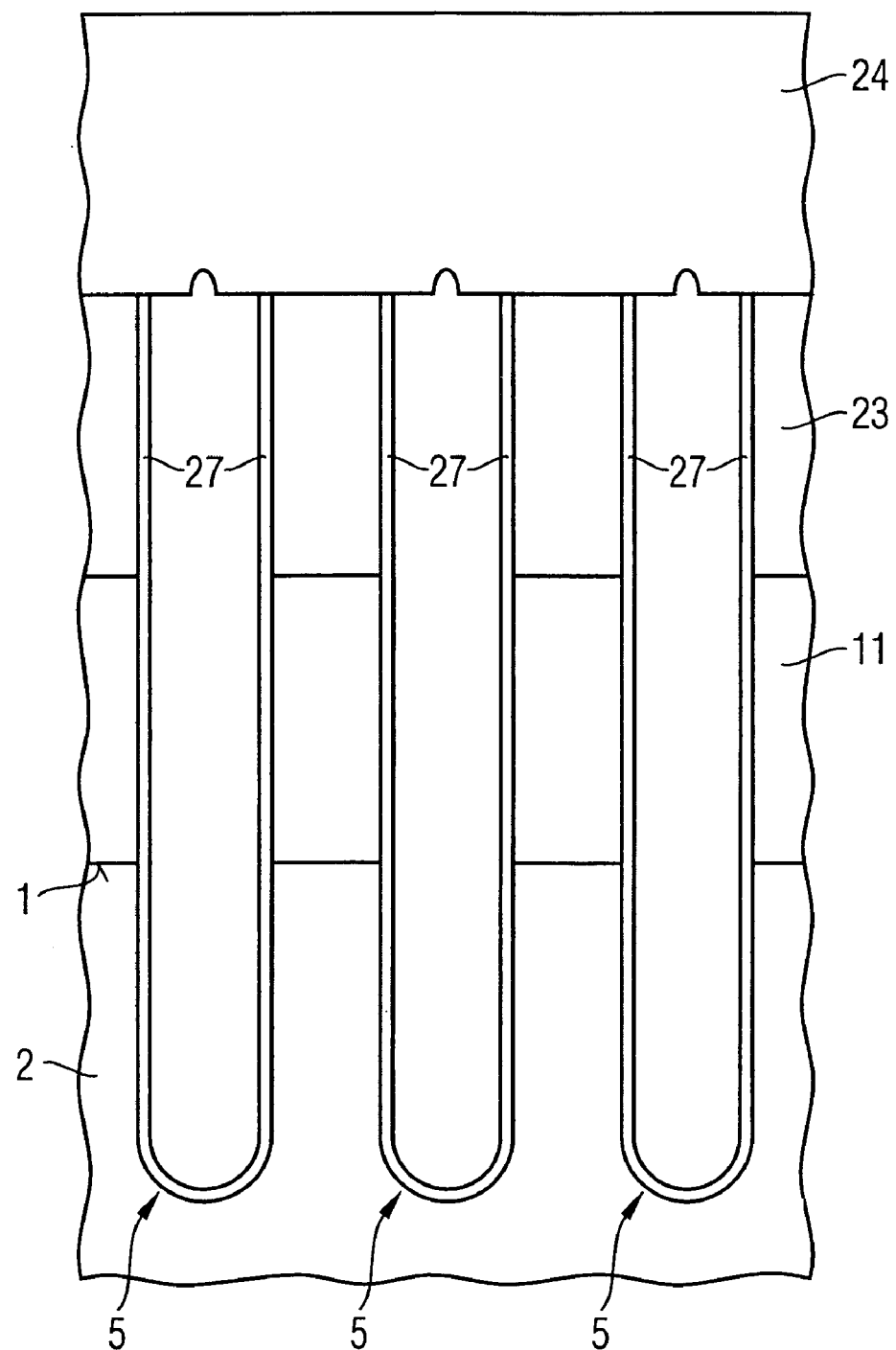

The covering layer 27 is removed and deposited again in the entire trench formed previous. The hard mask layers are removed and a new selective epitaxy method is carried out, thereby forming the third epitaxial layer 24. The construction shown in FIG. 23 is produced.

A hard mask comprising an $SiO_2$ layer 3, an $Si_3N_4$ layer 4 and a BPSG layer 12 is once again applied, a photoresist layer 13 is applied by known methods and exposed using a trench mask corresponding to that which was also used during the previous lithography steps. As in the preceding steps, the hard mask is patterned photolithographically. The partial trenches are then etched in the third epitaxial layer 24 in the manner described above.

The bottom capacitor electrode 6, the storage dielectric 7 and the top capacitor electrode 8 are subsequently defined. In this case, the bottom capacitor electrode is again formed from an n+-doped region 6. By way of example, this may be done as in the first exemplary embodiment by deposition of an arsenic-doped silicate glass layer with a layer thickness of 50 nm and of a TEOS-$SiO_2$ layer with a thickness of 20 nm and a subsequent heat treatment step at 1000° C., 120 seconds by outdiffusion from the arsenic-doped silicate glass layer into the semiconductor substrate 2 and the epitaxial layers 11, 23, 24 applied thereto. As an alternative, a gas phase doping may also be carried out, e.g., with the following parameters: 900° C., 3 torr tributylarsine (TBA) [33%], 12 minutes.

Afterward, an $Si_3N_4$ layer having a thickness of 4.7 nm and an $SiO_2$ layer having a thickness of 1.5 nm are deposited as dielectric layer 7. Three hundred nanometers (300 nm) of in-situ doped polysilicon are subsequently deposited.

Analogously to the first exemplary embodiment, the deposited polysilicon layer 8 is planarized by chemical mechanical polishing and etched to approximately 10 nm below the surface of the third epitaxial layer 24. A sealing layer 9 made of silicon dioxide is formed by thermal oxidation or an HDP method with a layer thickness of 12 nm or 15 nm, analogously to the first exemplary embodiment.

Since the trenches that are to be etched in the fourth epitaxial layer 25, which will be formed subsequently, have a smaller width than the previous trenches, the sealing layer 9 in this case also has the task of ensuring the continuous insulation of the two capacitor electrodes 6, 8.

Figure 24:
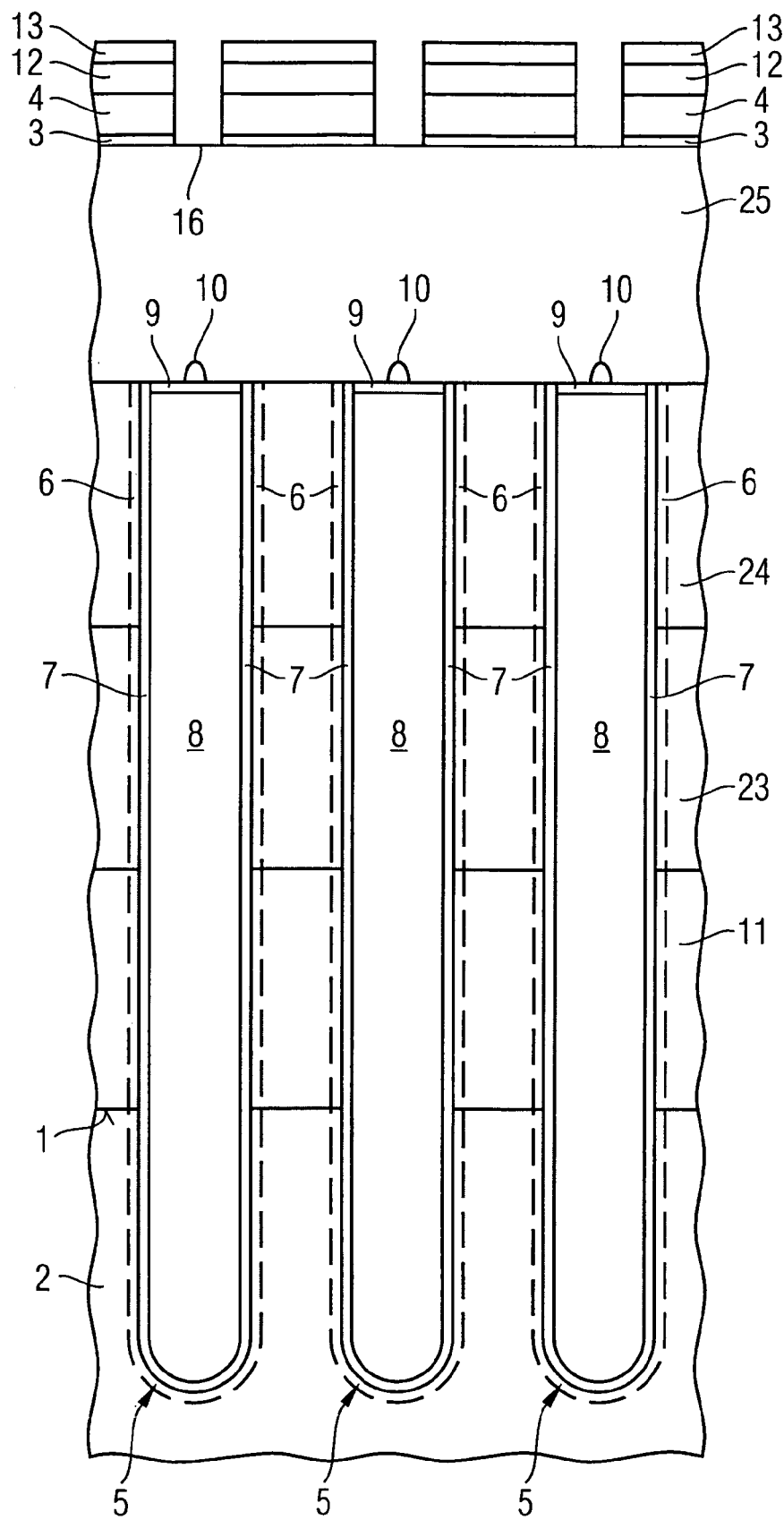

FIG. 24 shows the resulting construction. As is shown in FIG. 24, a renewed selective epitaxial method is subsequently carried out, as a result of which an epitaxial layer 25 is once again deposited with a layer thickness of 4.3 μm. Analogously to the first exemplary embodiment, said epitaxial layer 25 is patterned in that firstly the $SiO_2$ layer 3, the $Si_3N_4$ layer 4 and the BPSG layer 12 are applied as hard mask layers, and then the photoresist layer 13 is applied and exposed using a trench mask. The trench mask used during this last patterning step preferably has smaller openings than the mask used previously. As a result, it is possible to reduce the space requirement of the memory cells and nevertheless to obtain a high capacitance of the storage capacitors and a high conductance of the top electrodes 8. This is shown in FIG. 24.

Figure 25:
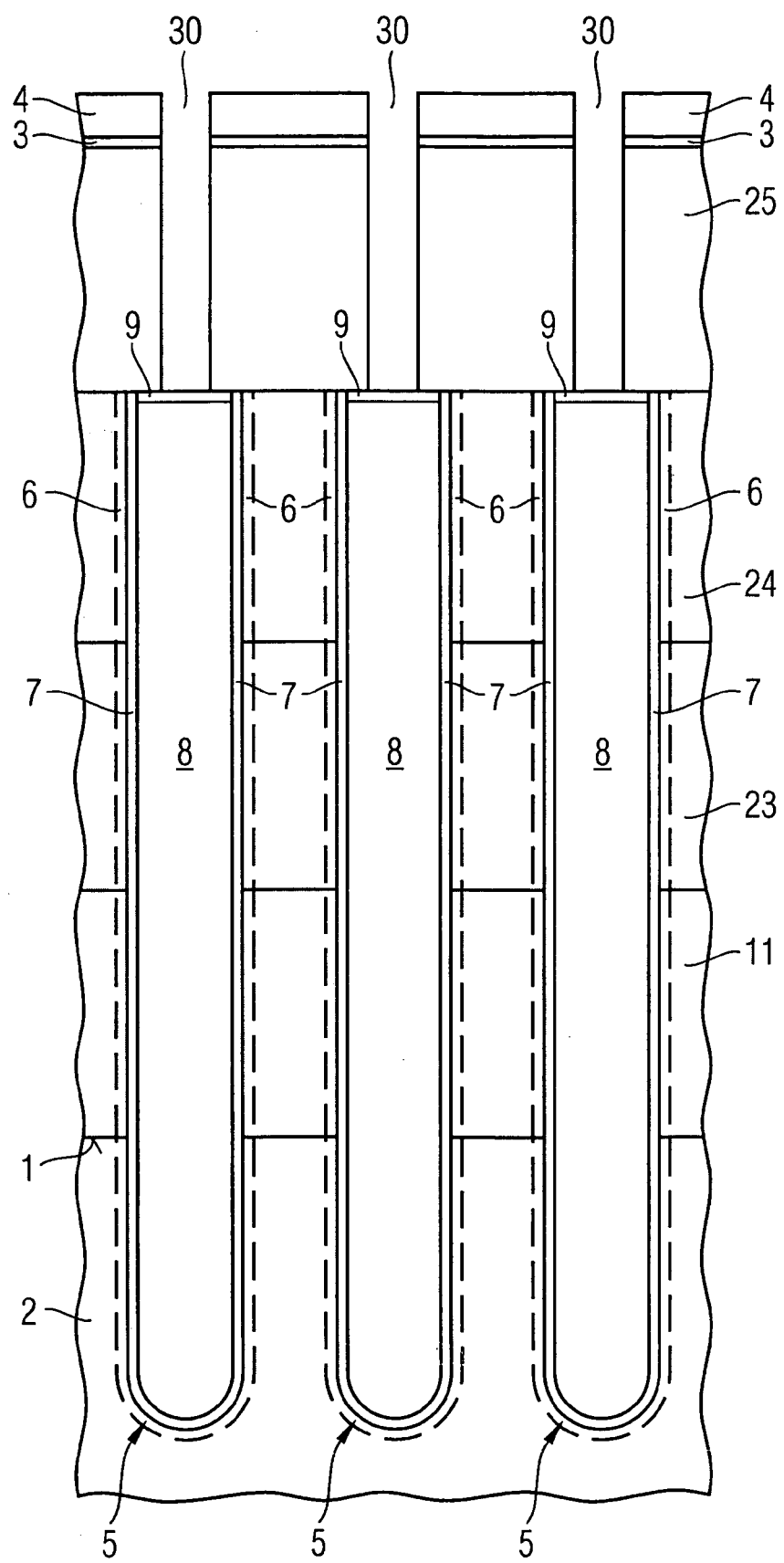

Analogously to the method steps described in FIGS. 8 to 12, the capacitor trenches are etched in the fourth epitaxial layer 25. This is illustrated in FIG. 25.

The uncovered parts of the sealing layer 9, that is to say the parts that are uncovered by the etching of the partial trenches 30 with a smaller diameter, are removed. Afterward, the bottom capacitor electrode is formed in the upper trench region analogously to the methods described above, it again being necessary to take account of the fact that—as is generally customary—the topmost trench region, in which the insulation collar is formed latter, has to be suitably protected against dopant diffusion.

Afterward, according to known methods, the dielectric layer 7 is formed, and a spacer layer 14 made of a-Si, for example, is formed in the upper trench region. After the removal of the spacer layer 14, the entire upper trench region is filled with a further in-situ n+ doped polysilicon layer 8 with a thickness of 300 nm, thereby producing the construction shown in FIG. 26.

Analogously to the method sequence described in the first exemplary embodiment, the trench capacitor is now completed and the further components of the memory cell are provided. The finished memory cell is shown in FIG. 27.

Figure 26:
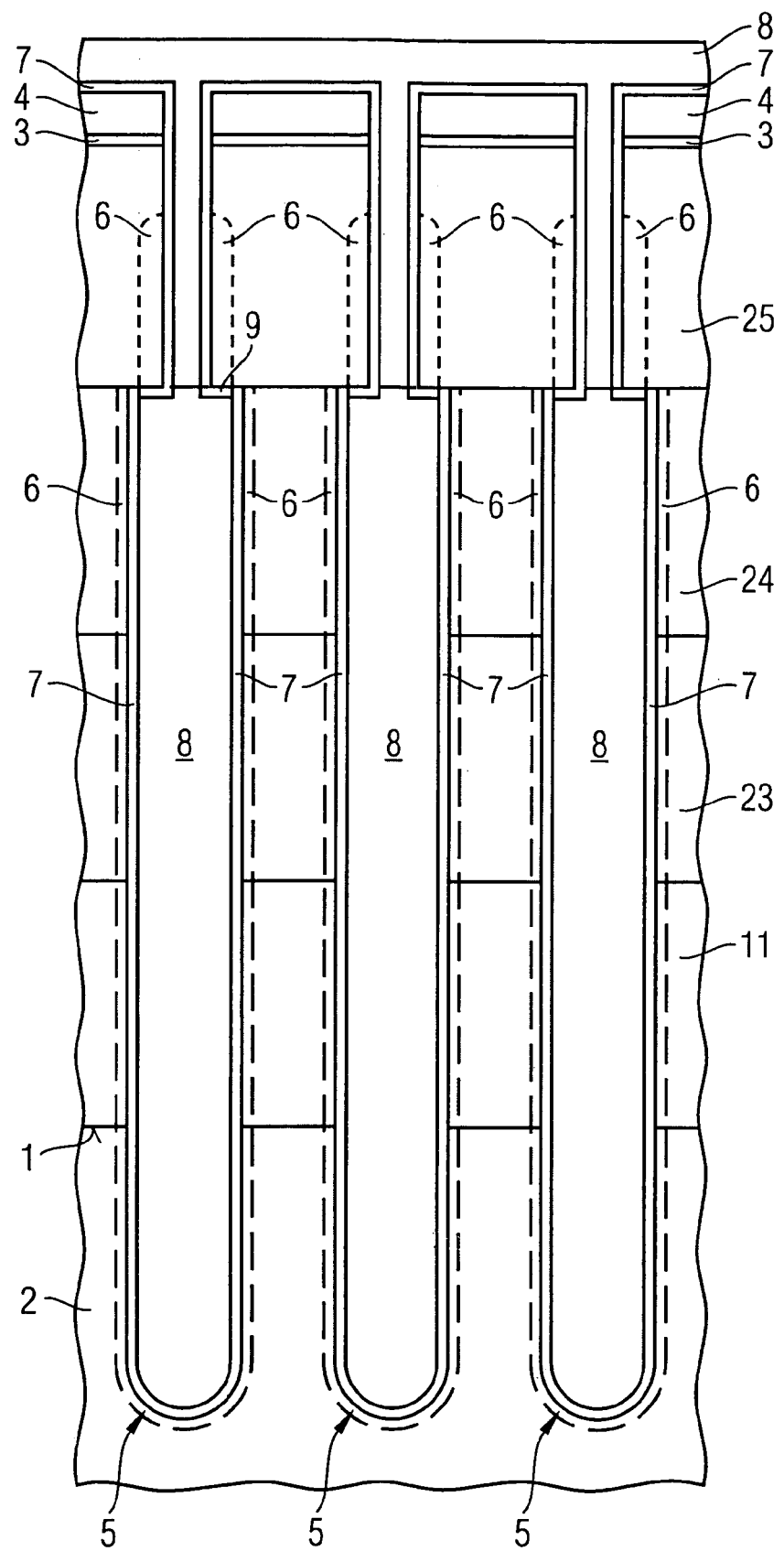
Figure 27:
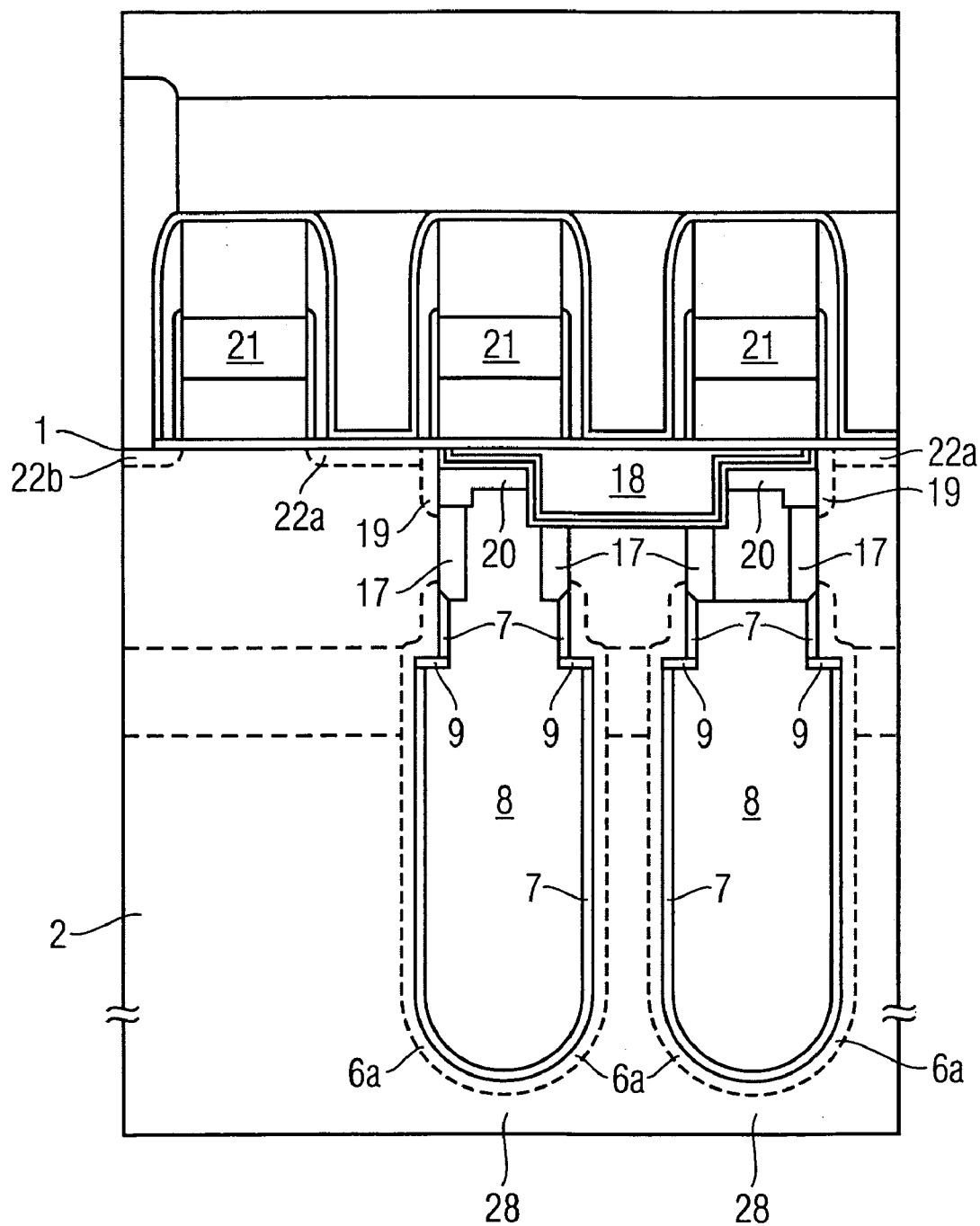
FIG. 27 shows a diagrammatic cross-sectional view of the essential components of a finished memory cell in accordance with the second embodiment.

As can be seen in FIGS. 26 and 27, the trench capacitor according to the invention has a larger trench cross section in its lower trench region, defined by the semiconductor substrate 2, the epitaxial layer 11, the second epitaxial layer 23, the third epitaxial layer 24, than in the upper trench region, which runs through the fourth epitaxial layer 25. By virtue of the fact that the bottom capacitor electrode 6a, the dielectric layer 7 and the top capacitor electrode 8 could be formed in this lower trench region before the fourth epitaxial layer 25 was formed, it is possible to fill all the layers in a manner free of shrink holes, as a result of which it is possible, in particular, to increase the conductance of the top capacitor electrode 8. The dielectric layer 7 formed in the lower trench part is linked to the dielectric layer 7 formed in the upper trench part via the horizontal section of the sealing layer 9, which was not removed after the etching of the last partial trench.

As a further variant of the second exemplary embodiment, it is also possible, of course, to etch the capacitor trenches in the fourth epitaxial layer 25 with the same cross section as in the case of the underlying trenches. In this case, the bottom capacitor electrode 6, the dielectric layer 7 and the top capacitor electrode 8 can be formed after the application and patterning of the fourth epitaxial layer 25. In this case, the capacitor electrodes and the dielectric material may advantageously comprise materials, which would not withstand the high thermal loading during the epitaxy method.

In particular, by way of example, a silicide layer with a doping layer situated underneath may be used as bottom capacitor electrode. A particularly appropriate silicide layer is a metal silicide layer, for example a refractory metal silicide layer, this being linked to the substrate via an underlying doping layer. The underlying doping layer is formed analogously to the previous method.

Furthermore, it is possible to use a stack comprising a metal layer and a barrier layer. In this case, the barrier layer, comprising an insulator layer in particular $SiO_2$, is applied directly on the trench wall and opened in its lower region in order to enable an electrical contact to the metal layer situated thereon. The metal layer comprises TiN, W, CO, Ta, Mo or further refractory metals or refractory metal compounds. In particular, so-called high-k materials may also be used as storage dielectric, and, in particular, polysilicon or alternatively metal or metal silicide may be used as top capacitor electrode.

The use of the above-mentioned materials or material combinations for the top capacitor electrode 8, the dielectric layer 7 and the bottom capacitor electrode 6a are advantageous to the effect that the capacitance of the capacitor can thereby be increased further.

Figure 17B:
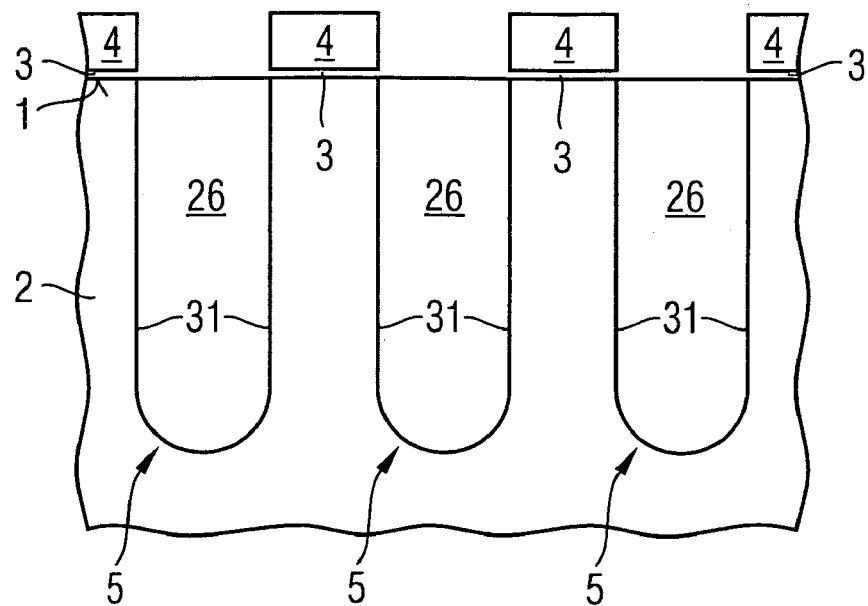

As a further method variant of the second exemplary embodiment, after the etching of the trench 5 in the silicon substrate, said trench may also be filled with a suitable sacrificial layer 26, for example made of $SiO_2$. This is shown in FIG. 17B. The fact that, after each step for etching a partial trench 30, the partial trench respectively produced can be filled with the sacrificial layer 26 results in a further simplification of the fabrication method.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of fabricating an integrated circuit, the method comprising:
   etching a trench into a surface of a semiconductor substrate, wherein a trench wall is exposed;
   forming at least one layer on the trench wall, wherein a topmost layer comprises a sealing layer made of a sealing material;
   performing a selective epitaxy method in such a way that a monocrystalline semiconductor layer is formed on the surface of the semiconductor substrate;
   etching a partial trench in a surface of the epitaxially grown semiconductor layer overlying the trench, wherein at least part of the sealing layer is uncovered; and
   removing the uncovered part of the sealing layer,
   wherein the trench and the partial trench form an unfilled stack trench.

2. The method as claimed in claim 1, wherein the selective epitaxy method is performed in such a way that no semiconductor material grows directly on the sealing layer.

3. A method of fabricating an integrated circuit, the method comprising:
   etching a trench into a surface of a semiconductor substrate, wherein a trench wall is exposed;
   forming at least one layer on the trench wall, wherein a topmost layer comprises a sealing layer made of a sealing material;
   performing a selective epitaxy method in such a way that a monocrystalline semiconductor layer is formed on the surface of the semiconductor substrate;
   etching a partial trench in a surface of the epitaxially grown semiconductor layer, wherein at least part of the sealing layer is uncovered;
   removing the uncovered part of the sealing layer:
   forming at least one layer on a trench wall of the partial trench, wherein a topmost layer comprises a second sealing layer made of a sealing material;
   performing a selective epitaxy method in such a way that a second monocrystalline semiconductor layer is formed on the surface of the first monocrystalline semiconductor layer;
   etching a second partial trench in a surface of the second monocrystalline semiconductor layer such that at least part of the second sealing layer is uncovered; and
   removing the uncovered part of the second sealing layer.

4. The method as claimed in claim 3, wherein the partial trench has a first diameter and the second partial trench has a second diameter, which differs from the first diameter.

5. The method as claimed in claim 4, wherein the second diameter is less than the first diameter.

6. The method as claimed in claim 1, wherein the monocrystalline semiconductor layer has a thickness that is less than a depth of the trench etched into the semiconductor substrate.

7. The method as claimed in claim 1, wherein the semiconductor substrate comprises monocrystalline silicon.

8. The method as claimed in claim 1, wherein the monocrystalline semiconductor layer comprises monocrystalline silicon.

9. The method as claimed in claim 1, wherein the trench and the partial trench have a same diameter.

10. The method as claimed in claim 1, wherein the partial trench has a diameter, which differs from the diameter of the trench.

11. The method as claimed in claim 10, wherein the diameter of the partial trench is less than the diameter of the trench.

12. The method as claimed in claim 1, further comprising:
forming a bottom capacitor electrode adjoining the trench wall;
forming a capacitor dielectric adjacent the bottom capacitor electrode; and
forming a top capacitor electrode adjacent the capacitor dielectric, wherein the bottom capacitor electrode, the capacitor dielectric and the top capacitor electrode are each arranged at least partly in the trench.

13. The method as claimed in claim 12, wherein forming at least one layer on the trench wall comprises said forming a bottom capacitor electrode.

14. The method as claimed in claim 13, wherein forming at least one layer on the trench wall further comprises providing the capacitor dielectric.

15. The method as claimed in claim 14, wherein forming at least one layer on the trench wall farther comprises filling the trench with a filling material and covering a surface of the filled trench with the sealing layer.

16. The method as claimed in claim 15, wherein the filling material is a material suitable for forming a top capacitor electrode.

17. The method as claimed in claim 12, wherein forming the bottom capacitor electrode, forming the capacitor dielectric and forming the top capacitor electrode are carried out after etching the partial trench in the surface of the epitaxially grown semiconductor layer.

18. The method as claimed in claim 1, wherein forming at least one layer on the trench wall comprises providing a sacrificial layer.

19. The method as claimed in claim 18, wherein the sacrificial layer is doped in such a way that it is suitable for effecting a doping of adjoining semiconductor material in a downstream thermal treatment step.

20. The method as claimed in claim 19, further comprising effecting the doping of the adjoining semiconductor material.

21. The method as claimed in claim 18, wherein the sacrificial layer comprises silicon dioxide.

22. A method for fabricating an integrated circuit comprising a trench capacitor, the method comprising:
etching a trench into a surface of a semiconductor substrate, wherein a trench wall is exposed;
forming at least one layer on the trench wall, wherein a topmost layer is a sealing layer made of a sealing material;
performing a selective epitaxy method in such a way that a monocrystalline semiconductor layer is formed on the surface of the semiconductor substrate;
etching a partial trench in a surface of the epitaxially grown semiconductor layer, wherein at least part of the sealing layer is uncovered;
removing the uncovered part of the sealing layer;
forming a bottom capacitor electrode in the semiconductor substrate and the epitaxially grown semiconductor layer;
forming a capacitor dielectric adjacent the bottom capacitor electrode; and
forming a top capacitor electrode adjacent the capacitor dielectric, wherein the capacitor dielectric and the top capacitor electrode are arranged at least partly in the trench and the partial trench.

23. The method as claimed in claim 22, wherein the selective epitaxy method is performed in such a way that the sealing layer is overgrown.

24. The method as claimed in claim 22, wherein the trench has a depth and a smallest diameter and the ratio of the depth to the smallest diameter is greater than 70.

25. The method as claimed in claim 4, wherein the first diameter is less than the diameter of the trench.

26. The method as claimed in claim 1, wherein the selective epitaxy method is performed such that a surface of the trench that is covered by the sealing material is overgrown.

27. The method as claimed in claim 1, wherein
the unfilled stack trench has a depth and a smallest diameter, wherein the ratio of the depth to the smallest diameter is greater than 70.

28. The method as claimed in claim 27, wherein the ratio of the depth to the smallest diameter is greater than 80.

29. The method as claimed in claim 28, wherein the ratio of depth to smallest diameter is greater than or equal to 85.

30. The method of claim 22, further comprising forming a selection transistor with a first source/drain electrode, a second source/drain electrode, a conductive channel and a gate electrode, the top capacitor electrode being electrically conductively connected to the first source/drain electrode of the selection transistor.

* * * * *